United States Patent
Kim et al.

(10) Patent No.: US 10,347,613 B1
(45) Date of Patent: Jul. 9, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Byoung Chan Kim, Suwon-si (KR); Yong Ho Baek, Suwon-si (KR); Moon Il Kim, Suwon-si (KR); Young Sik Hur, Suwon-si (KR); Tae Hee Han, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/969,359

(22) Filed: May 2, 2018

(30) Foreign Application Priority Data

Dec. 22, 2017 (KR) ........................ 10-2017-0177955

(51) Int. Cl.
*H01L 27/00* (2006.01)
*H01L 25/10* (2006.01)
(Continued)

(52) U.S. Cl.
CPC ........ *H01L 25/105* (2013.01); *H01L 23/3121* (2013.01); *H01L 23/49811* (2013.01);
(Continued)

(58) Field of Classification Search
CPC ........... H01L 23/3121; H01L 23/49811; H01L 23/49822; H01L 24/16; H01L 24/20;
(Continued)

(56) References Cited

U.S. PATENT DOCUMENTS

| 5,258,660 A | 11/1993 | Nelson et al. |
| 8,106,504 B2 | 1/2012 | Yang |

(Continued)

FOREIGN PATENT DOCUMENTS

| CN | 101572260 A | 11/2009 |
| JP | 2004-327993 A | 11/2004 |
| KR | 10-1494414 B1 | 2/2015 |

OTHER PUBLICATIONS

Office Action issued in Taiwanese Patent Application No. 107114895 dated Mar. 7, 2019, with English translation.

*Primary Examiner* — Nikolay K Yushin
(74) *Attorney, Agent, or Firm* — Morgan Lewis & Bockius LLP

(57) ABSTRACT

A fan-out semiconductor package includes first and second structures. The first structure includes a first semiconductor chip, a first encapsulant, and a connection member. The second structure includes a second semiconductor chip, a second encapsulant, and conductive bumps. The first and second structures are disposed so that active surfaces of the first and second semiconductor chips face each other. The conductive bumps are electrically connected to a redistribution layer, and connection pads of the first and second semiconductor chips are connected to each other through the redistribution layer in a signal manner. Signal transmission times between one point of the redistribution layer and connection pads of each of the first and second semiconductor chips are substantially the same as each other.

20 Claims, 21 Drawing Sheets

(51) Int. Cl.
 *H01L 23/31* (2006.01)
 *H01L 23/00* (2006.01)
 *H01L 23/498* (2006.01)
 *H01L 25/065* (2006.01)
 *H01L 27/108* (2006.01)

(52) U.S. Cl.
 CPC ........ *H01L 23/49822* (2013.01); *H01L 24/16* (2013.01); *H01L 25/0652* (2013.01); *H01L 27/108* (2013.01); *H01L 2224/16227* (2013.01); *H01L 2225/1058* (2013.01)

(58) Field of Classification Search
 CPC ....... H01L 24/19; H01L 24/73; H01L 25/105; H01L 25/0652; H01L 25/50; H01L 25/065; H01L 27/108; H01L 27/14634; H01L 27/14636; H01L 2224/16227; H01L 2225/1058
 See application file for complete search history.

(56) References Cited

U.S. PATENT DOCUMENTS

| | | | |
|---|---|---|---|
| 9,793,217 B2* | 10/2017 | Lee | ............... H01L 23/5386 |
| 2004/0251529 A1 | 12/2004 | Lee et al. | |
| 2008/0001276 A1 | 1/2008 | Lee et al. | |
| 2011/0285007 A1 | 11/2011 | Chi et al. | |
| 2013/0292846 A1* | 11/2013 | Lee | ............... H01L 23/538 |
| | | | 257/774 |
| 2016/0329298 A1* | 11/2016 | Lee | ............... H01L 23/5386 |
| 2017/0194290 A1 | 7/2017 | Yu et al. | |

\* cited by examiner

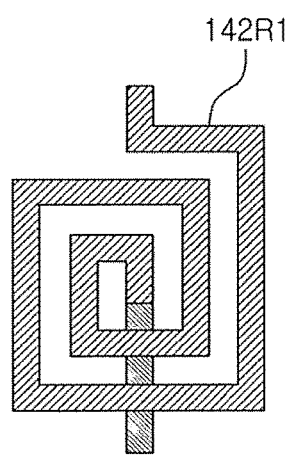
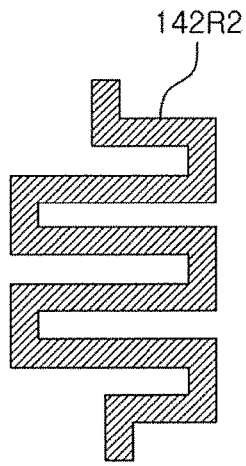
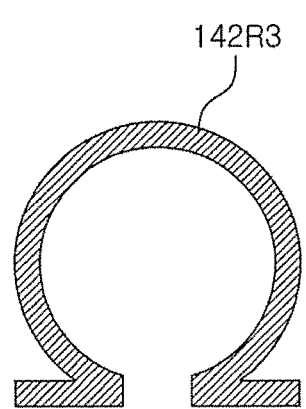
FIG. 13A     FIG. 13B     FIG. 13C
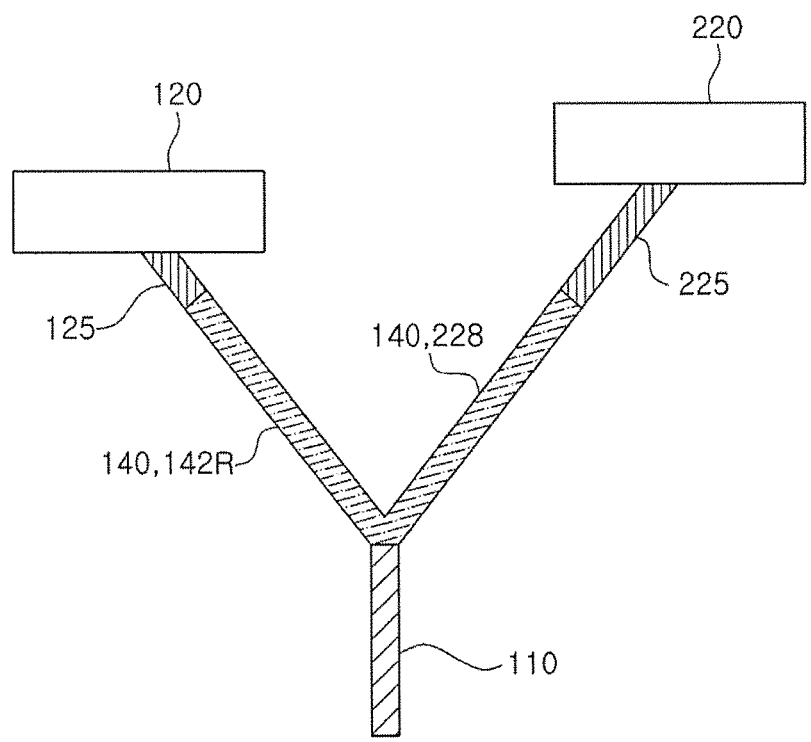
FIG. 14

FAN-OUT SEMICONDUCTOR PACKAGE

CROSS-REFERENCE TO RELATED APPLICATION(S)

This application claims benefit of priority to Korean Patent Application No. 10-2017-0177955 filed on Dec. 22, 2017 in the Korean Intellectual Property Office, the disclosure of which is incorporated herein by reference in its entirety.

BACKGROUND

1. Field

The present disclosure relates to a fan-out semiconductor package having a package-on-package (POP) form or a package-on-chip (POC) form.

2. Description of Related Art

Recently, in the semiconductor package field, die stack technology, for increasing capacity, has been continuously developed, and a speed of a device has also continuously increased in order to improve performance of a set. In a die stack package structure that is currently commonly used in products on the market, dies are stacked on a substrate to be offset from each other, and the respective dies are electrically connected to the substrate using wire bonding. In this case, wire lengths of the dies stacked in a vertical direction are different from each other, and a time delay problem may occur in transmitting signals.

SUMMARY

An aspect of the present disclosure may provide a fan-out semiconductor package capable of solving a time delay problem while including a plurality of semiconductor chips, maintaining a thin profile, and providing improved performance.

According to an aspect of the present disclosure, a fan-out semiconductor package may be provided in which a plurality of semiconductor chips are disposed in a package-on-package form or a package-on-chip form. The respective semiconductor chips are disposed so that active surfaces thereof face each other, and signal transmission times from the respective semiconductor chips to a redistribution layer redistributing the respective semiconductor chips are implemented to be substantially the same as each other.

According to an aspect of the present disclosure, a fan-out semiconductor package may include first and second structures. The first structure includes a first semiconductor chip having a first active surface having first connection pads disposed thereon and a first inactive surface opposing the first active surface, a first encapsulant encapsulating at least portions of the first semiconductor chip, and a connection member disposed on the first encapsulant and the first active surface and including a redistribution layer electrically connected to the first connection pads. The second structure includes a second semiconductor chip having a second active surface having second connection pads disposed thereon and a second inactive surface opposing the second active surface, a second encapsulant encapsulating at least portions of the second semiconductor chip, and conductive bumps disposed on the second active surface and electrically connected to the second connection pads. The first and second structures are disposed so that the first and second active surfaces face each other, the conductive bumps are electrically connected to the redistribution layer, and the first and second connection pads are electrically connected to each other through the redistribution layer in a signal manner. In one example, a signal transmission time from the first connection pad to one point of the redistribution layer and a signal transmission time from the second connection pad to the one point are substantially the same as each other.

According to another aspect of the present disclosure, a fan-out semiconductor package may include first and second structures. The first structure includes a first semiconductor chip having a first active surface having first and second signal pads disposed thereon and a first inactive surface opposing the first active surface, a first wiring member disposed on the first active surface of the first semiconductor chip and including a first wiring layer redistributing the first and second signal pads, a first encapsulant encapsulating at least portions of the first semiconductor chip and the first wiring member, and a connection member disposed on the first encapsulant and the first wiring member and including a redistribution layer electrically connected to the first and second signal pads through the first wiring layer, the first and second signal pads being spaced apart from each other. The second structure includes a second semiconductor chip having a second active surface having third and fourth signal pads disposed thereon and a second inactive surface opposing the second active surface, a second wiring member disposed on the second active surface of the second semiconductor chip and including a second wiring layer redistributing the third and fourth signal pads, a second encapsulant encapsulating at least portions of the second semiconductor chip and the second wiring member, and conductive bumps disposed on the second active surface and electrically connected to the third and fourth signal pads through the second wiring layer, the third and fourth signal pads being spaced apart from each other. The first and second structures are disposed so that the first and second active surfaces face each other, the conductive bumps are electrically connected to the redistribution layer, the first and fourth signal pads face each other in a cross section, the second and third signal pads face each other in the cross section, the first and third signal pads are redistributed to be connected to each other in a signal manner, and the second and fourth signal pads are redistributed to be connected to each other in a signal manner.

According to a further aspect of the present disclosure, a fan-out semiconductor package includes first and second semiconductor chips, a redistribution layer, and conductive bumps. The first semiconductor chip has a first active surface having first connection pads disposed thereon. The redistribution layer is disposed on the first active surface of the first semiconductor chip and is electrically connected to the first connection pads. The second semiconductor chip has a second active surface having second connection pads disposed thereon, and the second semiconductor chip is disposed to have the second active surface facing and overlapping with the first active surface of the first semiconductor chip. The conductive bumps are disposed on the second active surface and electrically connect second connection pads to the redistribution layer. The redistribution layer includes a resistance pattern in a conductive line electrically connected to at least one of the first and second connection pads.

BRIEF DESCRIPTION OF DRAWINGS

The above and other aspects, features, and advantages of the present disclosure will be more clearly understood from the following detailed description taken in conjunction with the accompanying drawings, in which:

FIGS. 13A through 13C are schematic views illustrating various examples of a resistance pattern included in a redistribution layer of a connection member of the fan-out semiconductor package of FIG. 9;

FIG. 14 is a schematic view illustrating signal transmission paths of each of first and second semiconductor chips of the fan-out semiconductor package to which the resistance patterns of FIGS. 13A through 13C are applied;

DETAILED DESCRIPTION

Hereinafter, exemplary embodiments will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the lower direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection that nonetheless provides electrical connectivity. It can be understood that when an element is referred to with terms such as "first" and "second", the element is not limited thereby. The terms first and second may be used for a purpose of distinguishing one element from other elements, and may not limit the sequence or importance of the elements. In some cases, a first element may be referred to as a second element without departing from the scope of the description or claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limit the disclosure. In this case, singular forms include plural forms unless interpreted otherwise in context.

Electronic Device

Figure 1:
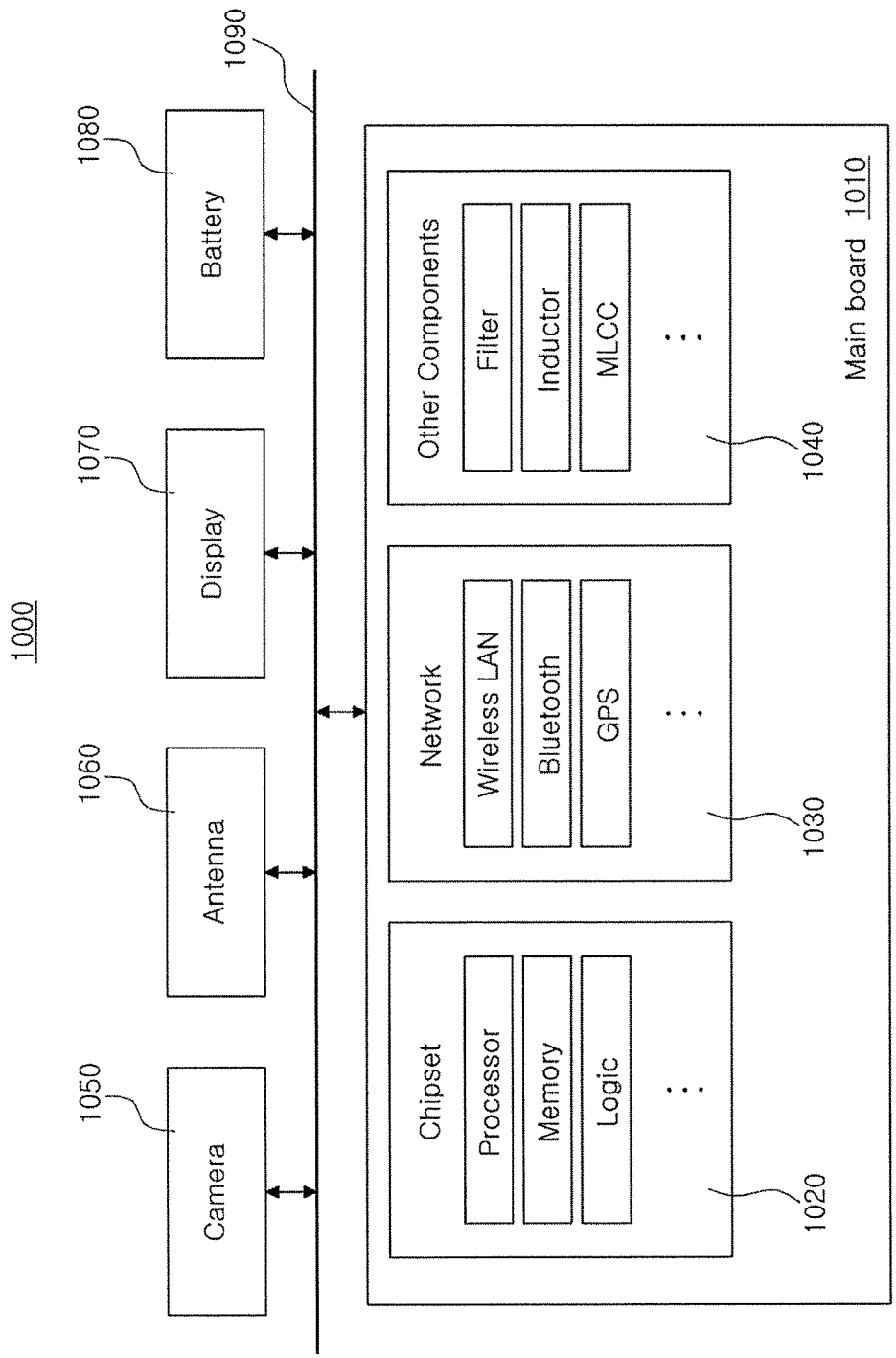
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 or motherboard may include chip related components 1020, network related components 1030, other components 1040, and the like, physically or electrically connected thereto. These components may be connected to others to be described below across various signal lines 1090.

The chip related components 1020 or chipset may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include components for supporting communications using various protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components supporting a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
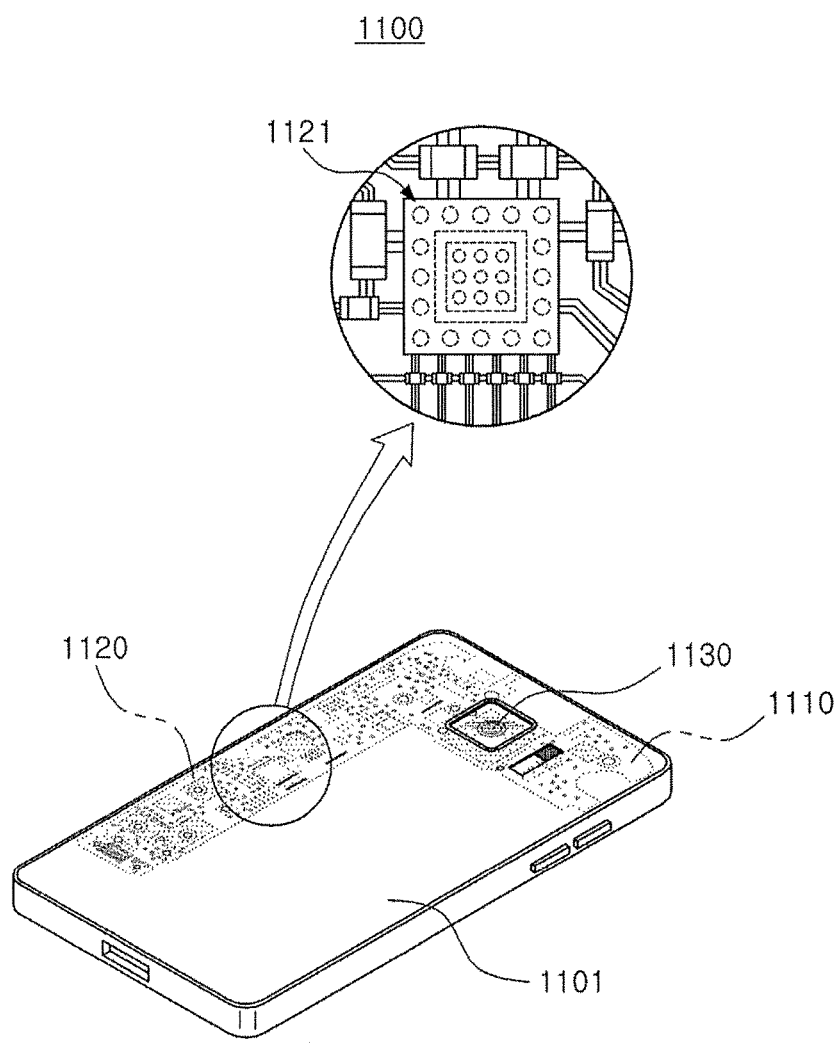
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used by itself, but may be packaged and used in an electronic device, or the like, in a packaged state.

Additionally, semiconductor packaging can be used to compensate for the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are commonly significantly larger than those of the semiconductor chip. Therefore, it may be difficult to directly mount the semiconductor chip on the mainboard, and packaging technology for buffering a difference in a circuit width between the semiconductor chip and the mainboard is advantageously used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in detail with reference to the drawings.

Fan-in Semiconductor Package

Figure 3B:
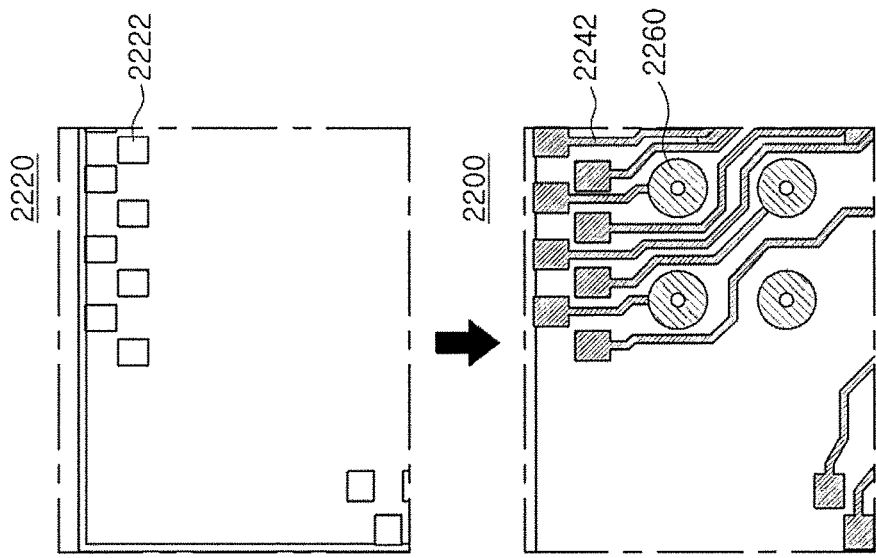
FIGS. 3A and 3B are schematic cross-sectional views illustrating a fan-in semiconductor package before and after being packaged.
Figure 3A:
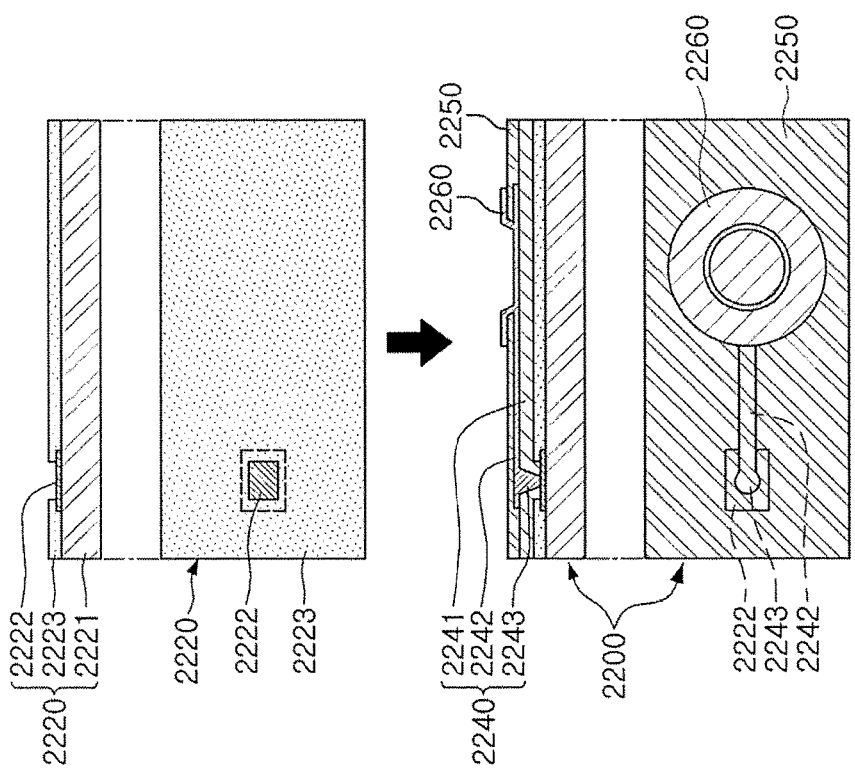

FIGS. 3A and 3B are schematic cross-sectional views illustrating a fan-in semiconductor package before and after being packaged.

Figure 4:
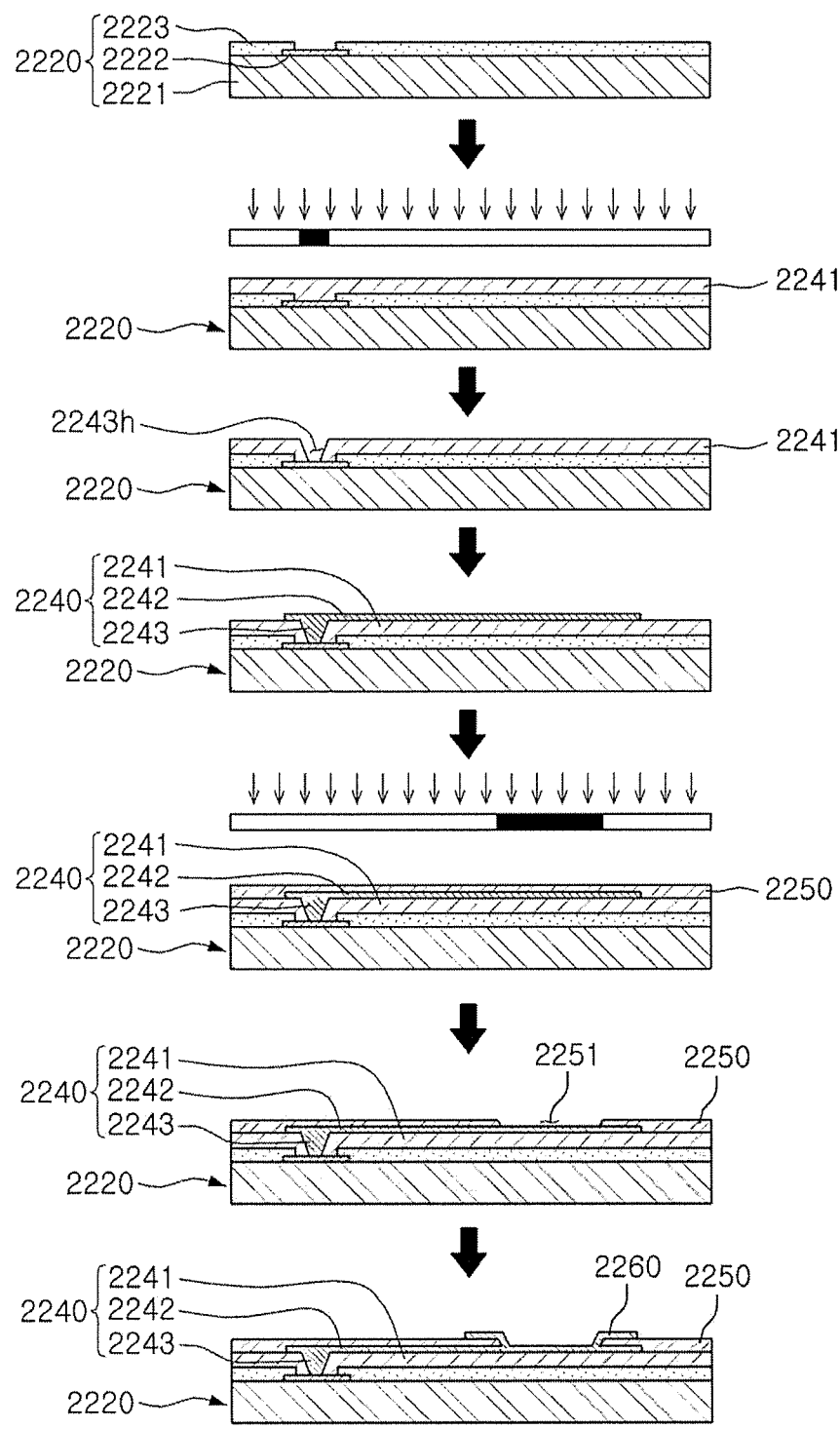
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside a footprint or area of overlap with the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals are disposed inside the footprint or area of overlap with the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
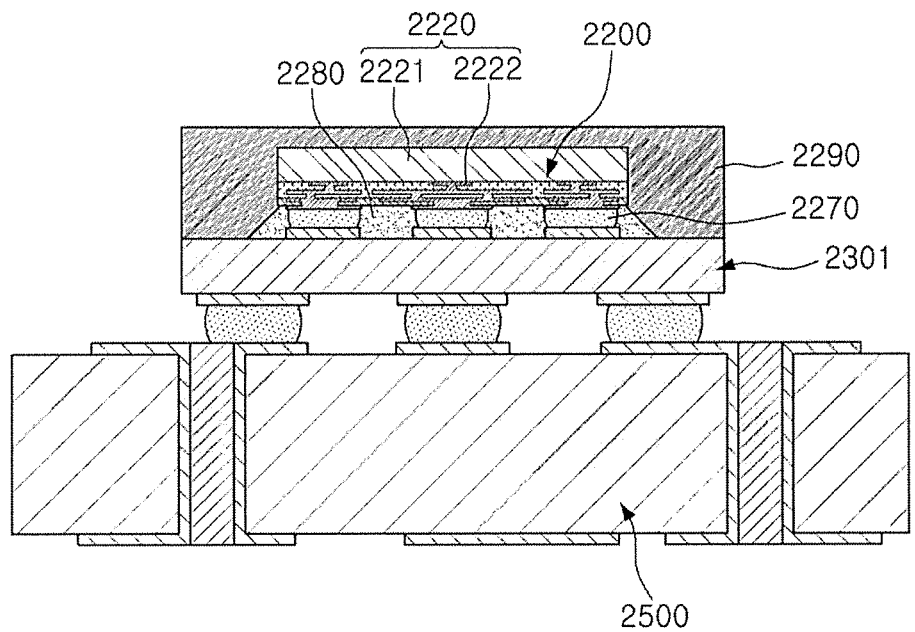
FIG. 5 is a schematic cross-sectional view illustrating a fan-in semiconductor package mounted on a ball grid array (BGA) substrate and ultimately mounted on a mainboard of an electronic device.

FIG. 5 is a schematic cross-sectional view illustrating a fan-in semiconductor package mounted on a ball grid array (BGA) substrate and ultimately mounted on a mainboard of an electronic device.

Figure 6:
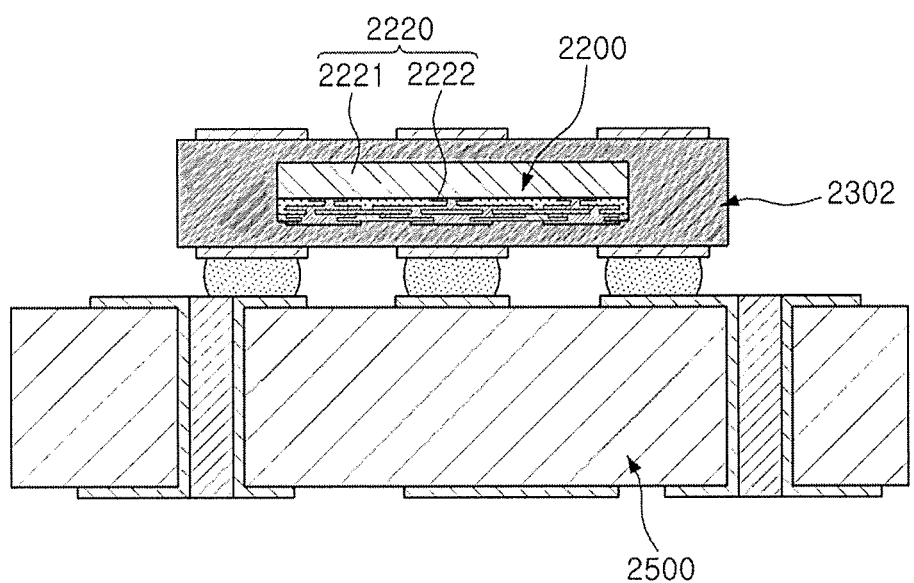
FIG. 6 is a schematic cross-sectional view illustrating a fan-in semiconductor package embedded in a BGA substrate and ultimately mounted on a mainboard of an electronic device.

FIG. 6 is a schematic cross-sectional view illustrating a fan-in semiconductor package embedded in a BGA substrate and ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
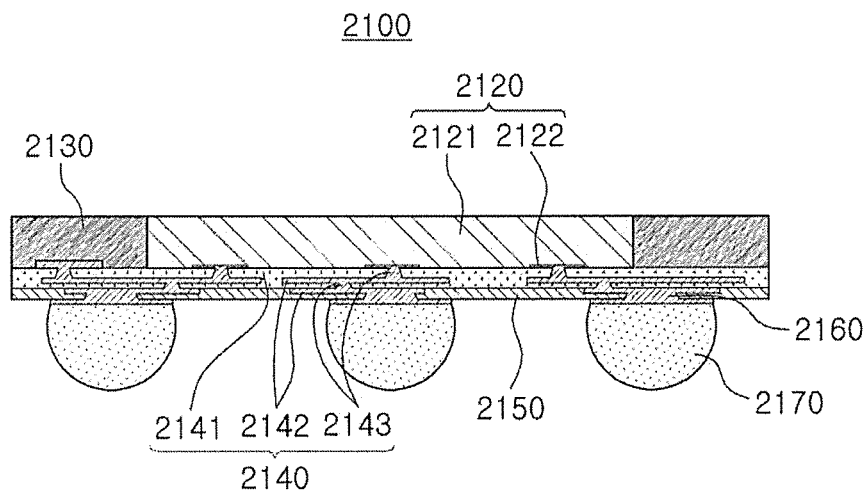
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the footprint or area of overlap with the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the footprint or area of overlap with the semiconductor chip through the connection member formed on the semiconductor chip. As described above, in the fan-in semiconductor package, all I/O terminals of the semiconductor chip need to be disposed inside the footprint of the semiconductor chip. Therefore, when a size of the semiconductor chip is decreased, a size and a pitch of balls need to be decreased, such that a standardized ball layout may not readily be used in the fan-in semiconductor package. On the other hand, the fan-out semiconductor package has the form in which the I/O terminals of the semiconductor chip are redistributed and disposed outwardly from the footprint of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
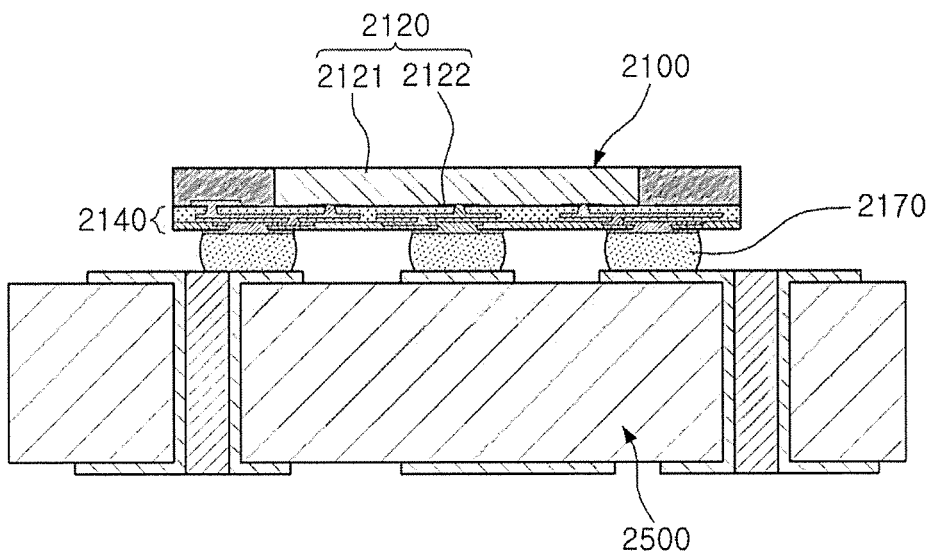
FIG. 8 is a schematic cross-sectional view illustrating a fan-out semiconductor package mounted on a mainboard of an electronic device.

FIG. 8 is a schematic cross-sectional view illustrating a fan-out semiconductor package mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package capable of solving a time delay problem in spite of including a plurality of semiconductor chips and being thinned in spite of having improved performance will hereinafter be described with reference to the drawings.

Figure 9:
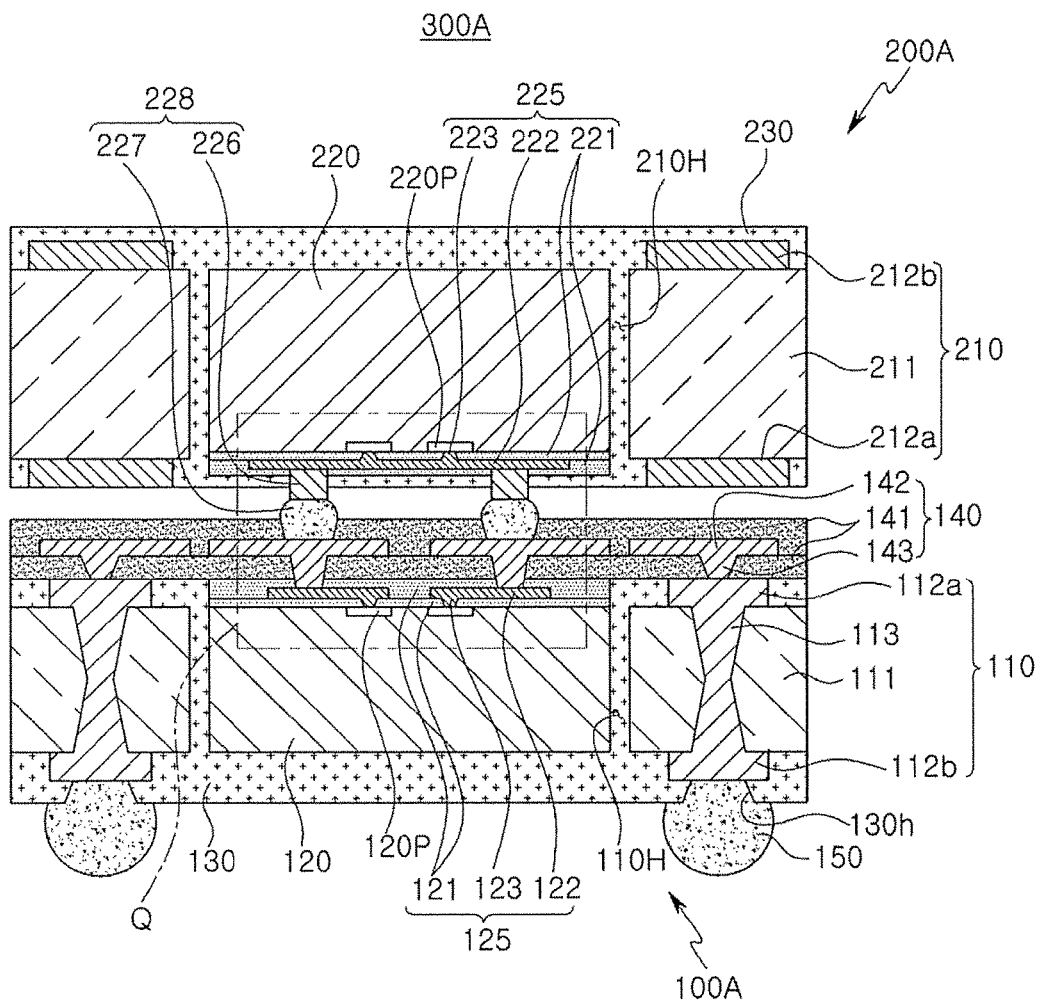
FIG. 9 is a schematic cross-sectional view illustrating an example of a fan-out semiconductor package.

FIG. 9 is a schematic cross-sectional view illustrating an example of a fan-out semiconductor package.

FIGS. 10A and 10B are schematic enlarged cross-sectional views illustrating region Q of the fan-out semiconductor package of FIG. 9.

Figure 10:
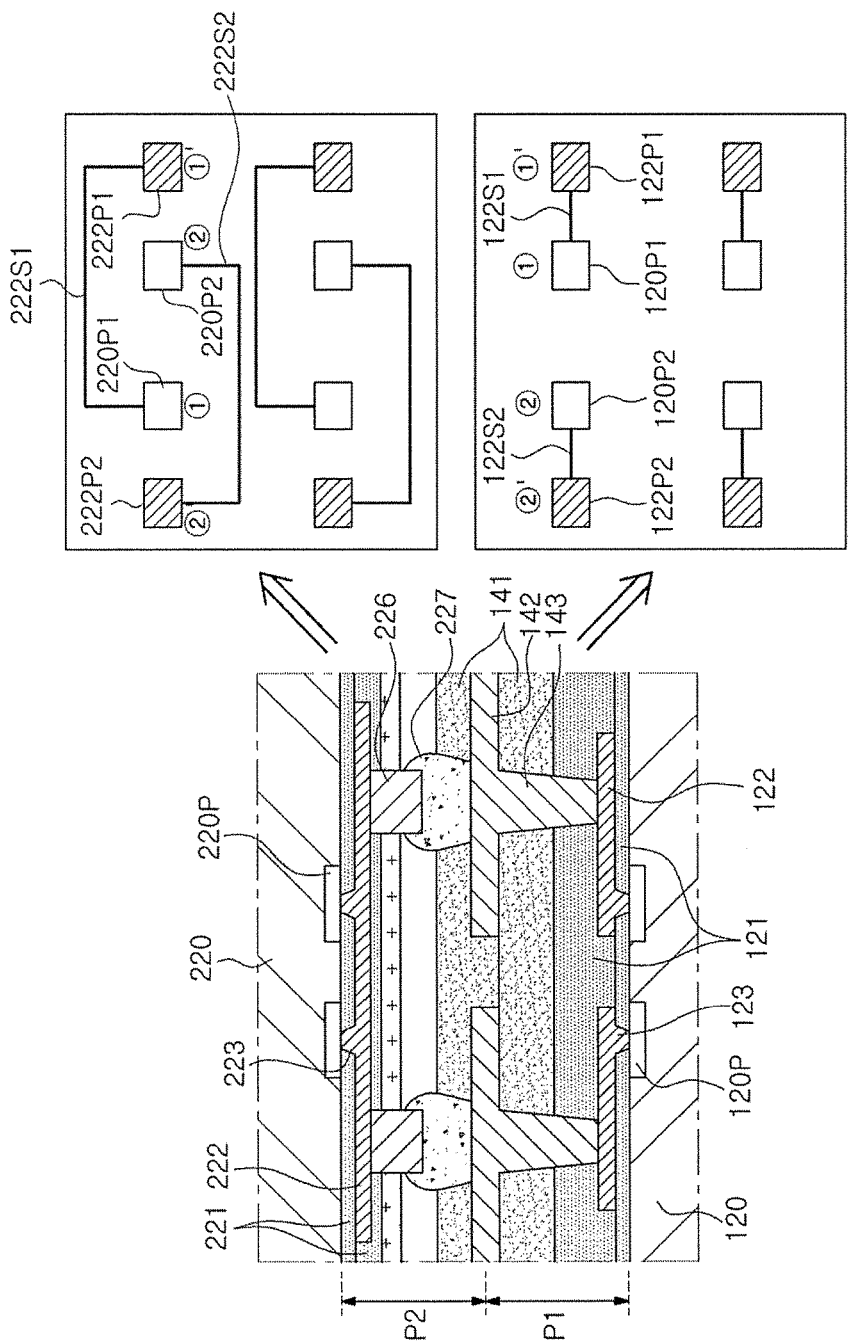
FIGS. 10A and 10B are schematic enlarged cross-sectional views illustrating region Q of the fan-out semiconductor package of FIG. 9.

Referring to FIGS. 9 and 10, a fan-out semiconductor package 300A according to an exemplary embodiment may include a first structure 100A including a first semiconductor chip 120 having a first active surface including first connection pads 120P disposed thereon and a first inactive surface opposing the first active surface, a first encapsulant 130 encapsulating at least portions of the first semiconductor chip 120, and a connection member 140 disposed on the first encapsulant 130 and the first active surface and including a redistribution layer 142 electrically connected to the first connection pads 120P; and a second structure 200A including a second semiconductor chip 220 having a second active surface having second connection pads 220P disposed thereon and a second inactive surface opposing the second active surface, a second encapsulant 230 encapsulating at least portions of the second semiconductor chip 220, and conductive bumps 228 disposed on the second encapsulant 230 and the second active surface and electrically connected to the second connection pads 220P. The first structure 100A and the second structure 200A may be disposed so that the first and second active surfaces face each other, and the conductive bumps 228 may be electrically connected to the redistribution layer 142.

Recently, in a semiconductor package field, die stack technology for increasing a capacity has been continuously developed, and a speed of a device has also continuously increased in order to improve performance of a set. In a die stack package structure that is currently used commonly in the market, dies are stacked on a substrate to be offset from each other, and the respective dies are electrically connected to the substrate using wire bonding. In this case, wire lengths of the dies stacked at different positions in a vertical direction (e.g., a direction orthogonal to a surface of the substrate on which the dies are mounted) are different from each other, and a time delay problem thus occurs in transmitting signals. Particularly, when memories such as DRAMs are stacked, pads of the respective memories are implemented by center pads in order to increase a net die, and are then redistributed to edge pads by an aluminum (Al) redistribution layer (RDL). However, the aluminum redistribution layer has electrical conductivity relatively lower than that of a copper redistribution layer (Cu RDL), and a larger time delay in transmitting signals thus occurs. Therefore, there is a limitation in applying the aluminum redistribution layer to the DRAM, or the like, requiring a high speed.

Figure 11:
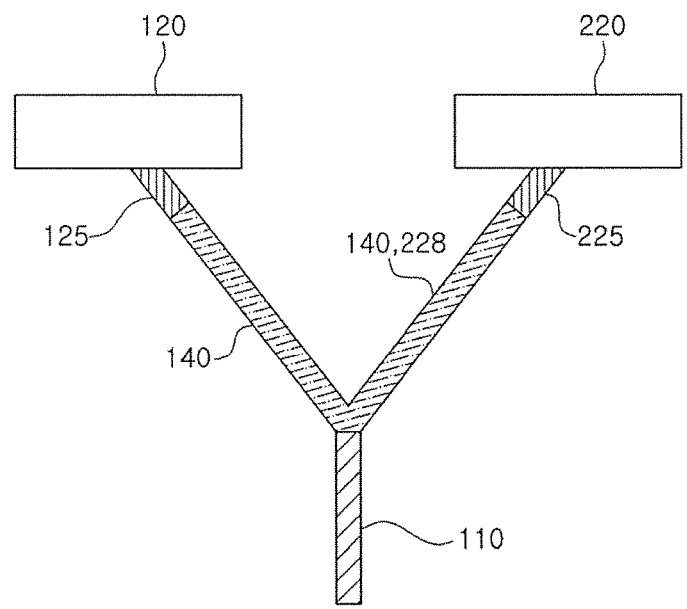
FIG. 11 is a schematic view illustrating signal transmission paths of each of first and second semiconductor chips of the fan-out semiconductor package of FIG. 9.
Figure 12:
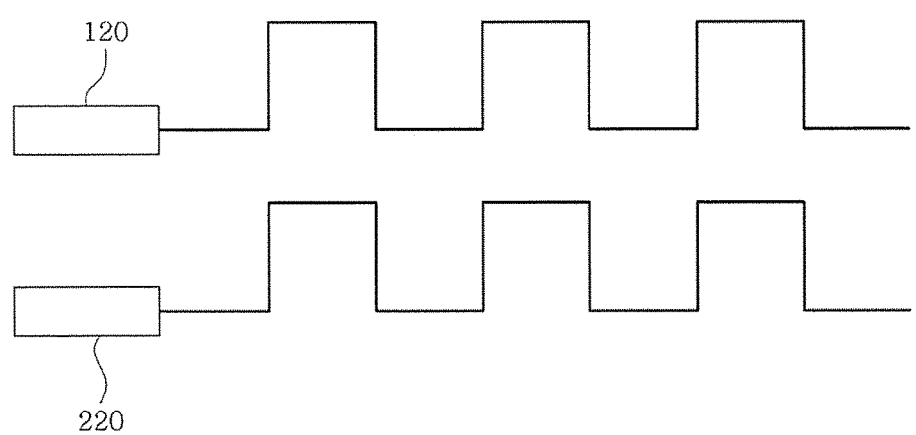
FIG. 12 is a schematic view illustrating signal transmission times of the first and second semiconductor chips having the signal transmission paths of FIG. 11.

On the other hand, in the fan-out semiconductor package 300A according to the exemplary embodiment, the first and second semiconductor chips 120 and 220 may be disposed in a package-on-package form, and the first semiconductor chip 120 and the second semiconductor chip 220 may be disposed so that the first and second active surfaces face each other. In addition, the first and second semiconductors 120 and 220 may be connected through the redistribution layer 142 and the conductive bumps 228 rather than wiring bonding, in a signal manner. Particularly, the first and second connection pads 120P and 220P may share the redistribution layer 142 with each other to be connected to each other at any one point of the redistribution layer 142 in a signal manner. In this case, the first and second connection pads 120P and 220P may be redistributed so that a signal transmission time from the first connection pad 120P to one point of the redistribution layer 142 and a signal transmission time from the second connection pad 220P to one point of the redistribution layer 142 are substantially the same as each other, as illustratively shown in FIGS. 11 and 12. For example, a signal transmission distance P1 from the first connection pad 120P to one point of the redistribution layer 142 and a signal transmission distance P2 from the second connection pad 220P to one point of the redistribution layer 142 may be implemented to be substantially the same as each other to solve a time delay problem, as illustratively shown in FIGS. 10A, 11, and 12. In addition, even though the fan-out semiconductor package 300A has a package-on-package form, the fan-out semiconductor package 300A may be thinned as much as possible, and a signal path between the first and second semiconductor chips 120 and 220 may be significantly reduced.

Meanwhile, the first structure 100A may further include a first wiring member 125 disposed between the first active surface and the connection member 140 and including a first wiring layer 122 redistributing the first connection pads 120P to electrically connect the first connection pads 120P to the redistribution layer 142. Similarly, the second structure 200A may further include a second wiring member 225 disposed between the second active surface and the conductive bumps 228 and including a second wiring layer 222 redistributing the second connection pads 220P to electrically connect the second connection pads 220P to the conductive bumps 228. In this way, the first and second connection pads 120P and 220P formed in a center pad form may be primarily redistributed. However, in the fan-out semiconductor package 300A according to the exemplary embodiment, the first and second connection pads 120P and 220P are substantially redistributed through the connection member 140 of the first structure 100A and the conductive bumps 228 of the second structure 200A rather than wire bonding, a path of redistribution through the first and second wiring members 125 and 225 may thus be significantly reduced or be omitted, if necessary, to improve signal transmission characteristics.

Meanwhile, the first and second semiconductor chips 120 and 220 may be the same type of memories, for example, DRAMs. In this case, the first connection pads 120P may include first and second signal pads 120P1 and 120P2 spaced apart from each other, and the second connection pads 220P may include third and fourth signal pads 220P1 and 220P2 spaced apart from each other. In addition, the first and fourth signal pads 120P1 and 220P2 may face each other, and the second and third signal pads 120P2 and 220P1 may face each other, in a cross section, but the first and third signal pads 120P1 and 220P1 may be redistributed by a redistribution process to be connected to each other in a signal manner, and the second and fourth signal pads 120P2 and 220P2 may be redistributed by the redistribution process to be connected to each other in a signal manner. For example, when the first and second semiconductor chips 120 and 220, which are the same DRAMs, are disposed so that the active surfaces thereof face each other, the first and fourth signals pads 120P1 and 220P2 performing different functions may face each other (□ and □) and the second and third signal pads 120P2 and 220P1 performing different functions may face each other (□ and □), in a cross section. When the first to fourth signal pads are primarily redistributed through signal patterns 122S1, 122S2, 222S1, and 222S2 of the first and second wiring layers 122 and 222 to allow first and third pads 122P1 and the 222P1 to face each other (□' and □') and allow second and fourth pads 122P2 and 222P2 to face each other (□' and □') and the first and third pads 122P1 and the 222P1 and the second and fourth pads 122P2 and 222P2 are connected to each other, respectively, through the conductive bumps 228 and the redistribution layer 142 in a signal manner, the first and third signal pads 120P1 and 220P1 and the second and fourth signal pads 120P2 and 220P2 may be connected to each other, respectively, in a signal manner in a cross form. In this way, the redistribution layer may be easily applied to the memory such as the DRAM requiring a high speed.

Meanwhile, the first structure 100A may further include a first core member 110 having a first through-hole 110H in which the first semiconductor chip 120 is accommodated. In this case, the first encapsulant 130 may cover at least portions of the first core member 110 and the first inactive surface of the first semiconductor chip 120, and fill at least portions of the first through-hole 110H. The first core member 110 may include a plurality of wiring layers 112a and 112b electrically connected to the first and second connection pads 120P and 220P through the redistribution layer 142 and one layer or more vias 113 electrically connecting the plurality of wiring layers 112a and 112b to each other. More specifically, in the exemplary embodiment, the first core member 110 may include an insulating layer 111, a first wiring layer 112a disposed on a first surface of the insulating layer 111, a second wiring layer 112b disposed on a second surface of the insulating layer 111, and vias 113 penetrating through the insulating layer 111 and electrically connecting the first and second wiring layers 112a and 112b to each other. The first and second wiring layers 112a and 112b may be electrically connected to the first and second connection pads 120 and 220P. The first core member 110 may solve a warpage problem of the first structure 100A, reduce non-uniformity of an encapsulation thickness of the first encapsulant 130, and particularly, allow an electrical path for a connection between upper and lower portions to be easily introduced. In addition, the first and second connection pads 120P and 220P may be additionally redistributed by the first and second wiring layers 112a and 112b, and a degree of freedom in a wiring design may thus be improved. Similarly, the second structure 200A may further include a second core member 210 having a second through-hole 210H in which the second semiconductor chip 220 is accommodated. In this case, the second encapsulant 230 may cover at least portions of the second core member 210 and the second inactive surface of the second semiconductor chip 220, and fill at least portions of the second through-hole 210H.

The first encapsulant 130 may be formed on the other surface of the first core member 110 opposing one surface of the first core member 110 on which the connection member 140 is disposed, and may have openings 130h exposing at least portions of the second wiring layer 112b. In this case, electrical connection structures 150 electrically connected to the second wiring layer 112b exposed by the openings 130h may be disposed in the openings 130h. In this way, the fan-out semiconductor package 300A may be mounted on an external component such as the mainboard of the electronic device, or the like, and the first and second connection pads 120P and 220P may be electrically connected to the mainboard.

The respective components included in the fan-out semiconductor package 300A according to the exemplary embodiment will hereinafter be described in more detail.

The first core member 110, which is an additional component, may improve rigidity of the first structure 100A depending on the materials used, and serve to secure uniformity of a thickness of the first encapsulant 130. When the wiring layers 112a and 112b, the vias 113, and the like, are formed in the first core member 110, an electrical connection path between upper and lower portions of the first structure 100A may be provided. The first core member 110 may have the first through-hole 110H. The first semiconductor chip 120 may be disposed in the first through-hole 110H to be spaced apart from the first core member 110 by a predetermined distance. Side surfaces of the first semiconductor chip 120 may be surrounded by the first core member 110. The first core member 110 may include the insulating layer 111, the first wiring layer 112a disposed on an upper surface of the insulating layer 111, the second wiring layer 112b disposed on a lower surface of the insulating layer 111, and the vias 113 penetrating through the insulating layer 111 and electrically connecting the first and second wiring layers 112a and 112b to each other.

For example, a material including an inorganic filler and an insulating resin may be used as a material of the insulating layer 111. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Build up Film (ABF), FR-4, Bismaleimide Triazine (BT), a photoimageable dielectric (PID) resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used. In this case, excellent rigidity of the first structure 100A may be maintained, such that the first core member 110 may be used as a kind of support member.

The wiring layers 112a and 112b may include a conductive material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on designs of corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include pad patterns for vias, pad patterns for electrical connection structures, and the like. Thicknesses of the wiring layers 112a and 112b of the first core member 110 may be greater than that of the redistribution layer 142 of the connection member 140. The reason is that the first core member 110 may have a thickness similar to that of the first semiconductor chip 120, while the connection member 140 is commonly designed to remain thin.

The vias 113 may penetrate through the insulating layer 111 and electrically connect the first wiring layer 112a and the second wiring layer 112b to each other. A material of each of the vias 113 may be a conductive material. Each of the vias 113 may be completely filled with the conductive material, or the conductive material may be formed along a wall of each of via holes. Each of the vias 113 may be a through-via completely penetrating through the insulating layer 111, and may have a cylindrical shape or an hourglass shape, but is not limited thereto.

The first semiconductor chip 120 may be an integrated circuit (IC) that includes several hundred to several million or more elements integrated in a single chip. The first semiconductor chip 120 may be formed on the basis of an active wafer. In this case, a base material of a body may be silicon (Si), germanium (Ge), gallium arsenide (GaAs), or the like. Various circuits may be formed in the body. The first connection pads 120P may electrically connect the first semiconductor chip 120 to other components, and a conductive material such as aluminum (Al), or the like, may be used as a material of each of the first connection pads 120P. An active surface of the first semiconductor chip 120 refers to a surface of the first semiconductor chip 120 on which the first connection pads 120P are disposed, and an inactive surface of the first semiconductor chip 120 refers to a surface of the first semiconductor chip 120 opposing the active surface. A passivation layer (not illustrated) covering at least portions of the first connection pads 120P may be formed on the body of the first semiconductor chip 120, if necessary. The passivation layer (not illustrated) may be an oxide film, a nitride film, or the like, or be a double layer of an oxide layer and a nitride layer. An insulating layer (not illustrated), and the like, may also be further disposed in other required positions. The first semiconductor chip 120 may be a memory chip such as a volatile memory (such as a DRAM), a non-volatile memory (such as a ROM), a flash memory, or the like. However, the first semiconductor chip 120 is not limited thereto, but may also be another kind of chip.

The first wiring member 125 may primarily redistribute the first connection pads 120P of the first semiconductor chip 120. The first wiring member 125 may include first insulating layers 121 including photosensitive polyimide (PSPI), or the like, the first wiring layers 122 formed on the first insulating layers 121 and including aluminum (Al), copper (Cu), or the like, and first vias 123 formed in the first insulating layers 121, electrically connecting the first connection pads 120P and the first wiring layers 122 to each other, and including aluminum (Al), copper (Cu), or the like. The exposed first wiring layer 122 may be connected to vias 143 of the connection member 140, and may be electrically connected to the redistribution layer 142 of the connection member 140 through the vias 143.

The first encapsulant 130 may protect the first semiconductor chip 120. An encapsulation form of the first encapsulant 130 is not particularly limited, but may be a form in which the first encapsulant 130 surrounds at least portions of the first semiconductor chip 120. In this case, the first encapsulant 130 may cover the first core member 110 and the inactive surface of the first semiconductor chip 120, and fill at least portions of the first through-hole 110H. A certain material of the first encapsulant 130 is not particularly limited, but may be, for example, an insulating material. For example, the first encapsulant 130 may include ABF including an insulating resin and an inorganic filler. However, the material of the first encapsulant 130 is not limited thereto, but may also be a photoimageable encapsulant (PIE).

The connection member 140 may substantially redistribute the first and second connection pads 120P and 220P. Several tens to several millions of first and second connection pads 120P and 220P having various functions may be redistributed by the connection member 140, and may be physically or electrically externally connected through the electrical connection structures 150 depending on the functions. The connection member 140 may include insulating layers 141, the redistribution layers 142 formed on the insulating layers 141, and the vias 143 formed in the insulating layers 141 and electrically connecting the redistribution layers 142 to the first wiring layer 112a and the first connection pads 120P. The connection member 140 may include a larger number of insulating layers, redistribution layers, and vias, if necessary.

A material of each of the insulating layers 141 may be an insulating material. In this case, a photosensitive insulating material such as a PID resin may also be used as the insulating material. This case may be advantageous in forming fine patterns.

The redistribution layers 142 may include a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include pad patterns for vias, pad patterns for electrical connection structures, and the like.

The vias 143 may electrically connect the first connection pads 120P, the redistribution layers 142, the first wiring layer 112a, and the like, formed on different layers to each other, resulting in an electrical path in the first structure 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have any shape known in the related art such as a tapered shape.

The electrical connection structures 150 may be additionally configured to physically or electrically externally connect the fan-out semiconductor package 300A. For example, the fan-out semiconductor package 300A may be mounted on the mainboard of the electronic device, or the like, through the electrical connection structures 150. Each of the electrical connection structures 150 may be formed of a low melting point metal, for example, a solder such as an alloy including tin (Sn), more specifically, a tin (Sn)-aluminum (Al)-copper (Cu) alloy, or the like. However, this is only an example, and a material of each of the electrical connection structures 150 is not particularly limited thereto. Each of the electrical connection structures 150 may be a land, a ball, a pin, or the like. The electrical connection structures 150 may be formed as a multilayer or single layer structure. When the electrical connection structures 150 are formed as a multilayer structure, the electrical connection structures 150 may include a copper (Cu) pillar and a solder. When the electrical connection structures 150 are formed as a single layer structure, the electrical connection structures 150 may include a tin-silver solder or copper (Cu). However, this is only an example, and the electrical connection structures 150 are not limited thereto.

The number, an interval, a disposition form, and the like, of electrical connection structures 150 are not particularly limited, but may be sufficiently modified depending on design particulars. For example, the electrical connection structures 150 may be provided in an amount of several tens to several millions according to the numbers of first and second connection pads 120P and 220P, or may be provided in an amount of several tens to several millions or more or several tens to several millions or less.

At least one of the electrical connection structures 150 may be disposed in a fan-out region. The fan-out region refers to a region except for a region in which the first semiconductor chip 120 is disposed in, for example, the first structure 100A. That is, the fan-out semiconductor package 300A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

The second core member 210 may maintain rigidity of the second structure 200A depending on the materials used, and serve to secure uniformity of a thickness of the second encapsulant 230. The second semiconductor chip 220 may be disposed in the second through-hole 210H to be spaced apart from the second core member 210 by a predetermined distance. Side surfaces of the second semiconductor chip 220 may be surrounded by the second core member 210. The second core member 210 may include an insulating layer 211.

For example, a material including an inorganic filler and an insulating resin may be used as a material of the insulating layer 211. For example, a thermosetting resin such as an epoxy resin, a thermoplastic resin such as a polyimide resin, or a resin including a reinforcing material such as an inorganic filler, for example, silica, alumina, or the like, more specifically, ABF, FR-4, BT, a PID resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used. In this case, excellent rigidity of the second structure 200A may be maintained, such that the second core member 210 may be used as a kind of support member. First and second wiring layers 212a and 212b may be disposed on upper and lower surfaces of the insulating layer 211, respectively, and may be utilized as mark patterns.

The second semiconductor chip 220 may be an integrated circuit (IC) that includes several hundred to several million or more elements integrated in a single chip. The second semiconductor chip 220 may be formed on the basis of an active wafer. In this case, a base material of a body may be silicon (Si), germanium (Ge), gallium arsenide (GaAs), or the like. Various circuits may be formed in the body. The second connection pads 220P may electrically connect the second semiconductor chip 220 to other components, and a conductive material such as aluminum (Al), or the like, may be used as a material of each of the second connection pads 220P. An active surface of the second semiconductor chip 220 refers to a surface of the second semiconductor chip 220 on which the second connection pads 220P are disposed, and an inactive surface of the second semiconductor chip 220 refers to a surface of the second semiconductor chip 220 opposing the active surface. A passivation layer (not illustrated) covering at least portions of the second connection pads 220P may be formed on the body, if necessary. The passivation layer (not illustrated) may be an oxide film, a nitride film, or the like, or be a double layer of an oxide layer and a nitride layer. An insulating layer (not illustrated), and the like, may also be further disposed in other required positions. The second semiconductor chip 220 may be a memory chip such as a volatile memory (such as a DRAM), a non-volatile memory (such as a ROM), a flash memory, or the like. However, the second semiconductor chip 220 is not limited thereto, but may also be another kind of chip.

The second wiring member 225 may primarily redistribute the second connection pads 220P of the second semiconductor chip 220. The second wiring member 225 may include second insulating layers 221 including photosensitive polyimide (PSPI), or the like, the second wiring layers 222 formed on the first insulating layers 221 and including aluminum (Al), copper (Cu), or the like, and second vias 223 formed in the second insulating layers 221, electrically connecting the second connection pads 220P and the second wiring layers 222 to each other, and including aluminum (Al), copper (Cu), or the like. The exposed second wiring layer 222 may be connected to the conductive bumps 228. The conductive bump 228 may include a copper layer 226 and a solder layer 227. The copper layer 226 may be a copper (Cu) bump, a copper (Cu) pillar, or the like, and the solder layer 227 may be a solder ball including a low melting point metal such as tin (Sn). The low melting point metal refers to a metal of which a base material is not melted and only a filler metal is melted and which is used for bonding, such as a solder, and may be, for example, tin (Sn) or an alloy including tin (Sn) such as a tin (Sn)-aluminum (Al) alloy or a tin (Sn)-aluminum (Al)-copper (Cu) alloy, but is not limited thereto.

The second encapsulant 230 may protect the second semiconductor chip 220. An encapsulation form of the second encapsulant 230 is not particularly limited, but may be a form in which the second encapsulant 230 surrounds at least portions of the second semiconductor chip 220. In this case, the second encapsulant 230 may cover the second core member 210 and the inactive surface of the second semiconductor chip 220, and fill at least portions of the second through-hole 210H. A certain material of the second encapsulant 230 is not particularly limited, but may be, for example, an insulating material. For example, the second encapsulant 230 may include ABF including an insulating resin and an inorganic filler. However, the material of the second encapsulant 230 is not limited thereto, but may also be a PIE.

FIGS. 13A through 13C are schematic views illustrating various examples of a resistance pattern included in a redistribution layer of a connection member of the fan-out semiconductor package of FIG. 9.

FIG. 14 is a schematic view illustrating signal transmission paths of each of first and second semiconductor chips of the fan-out semiconductor package to which the resistance patterns of FIGS. 13A through 13C are applied.

Figure 15:
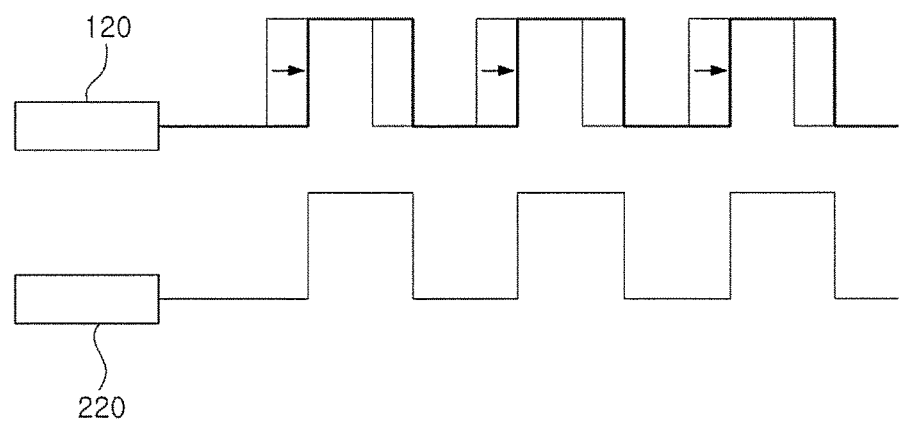
FIG. 15 is a schematic view illustrating signal transmission times of the first and second semiconductor chips having the signal transmission paths of FIG. 14.

FIG. 15 is a schematic view illustrating signal transmission times of the first and second semiconductor chips having the signal transmission paths of FIG. 14.

Referring to FIGS. 13A-13C, 14, and 15, various kinds of resistance patterns 142R1, 142R2, and 142R3 may be formed on or in the redistribution layer 142 of the connection member 140. The resistance patterns 142R1, 142R2, and 142R3 may be, for example, a pattern inductance, a capacitance, a resistance, and the like, such as a spiral inductor 142R1, a meander line 142R2, or a single loop 142R3. In some case, a signal transmission distance P1 from the first connection pad 120P to one point of the redistribution layer 142 and a signal transmission distance P2 from the second connection pad 220P to one point of the redistribution layer 142 may be different from each other. In this case, a line delay problem may occur. In this case, when the resistance patterns 142R1, 142R2, and 142R3 are formed on the redistribution layer 142, different signal transmission distances P1 and P2 may be compensated for (e.g., by delaying a signal from chip 120, as illustrative shown in FIG. 15), such that signal transmission times may become substantially the same as each other. That is, even when the signal transmission distances P1 and P2 are different from each other, a time delay problem may be solved.

Figure 16A:
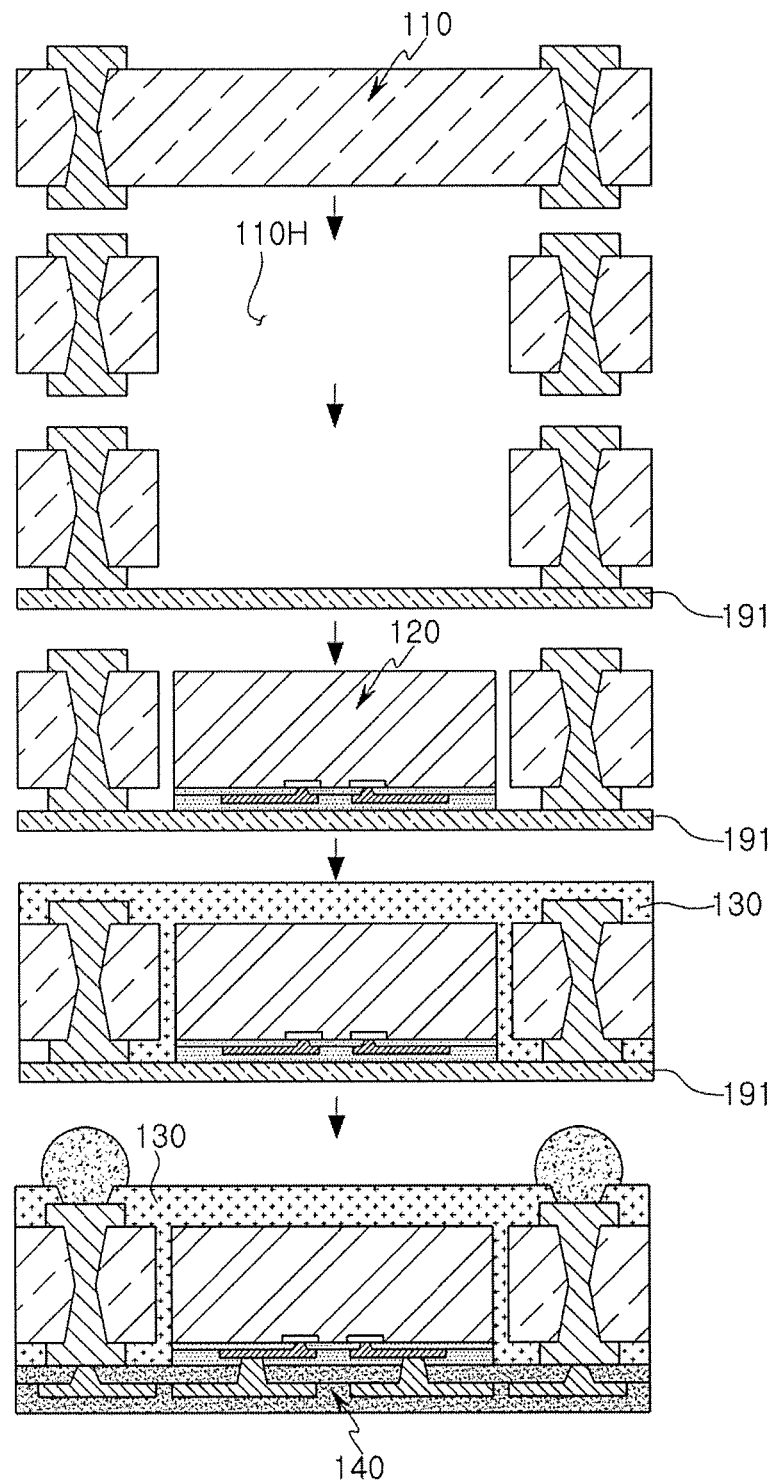
FIG. 16A is schematic views illustrating process steps of a method of manufacturing a first structure of the fan-out semiconductor package of FIG. 9.

FIG. 16A is schematic diagram illustrating process steps of a method of manufacturing a first structure of the fan-out semiconductor package of FIG. 9.

Figure 16B:
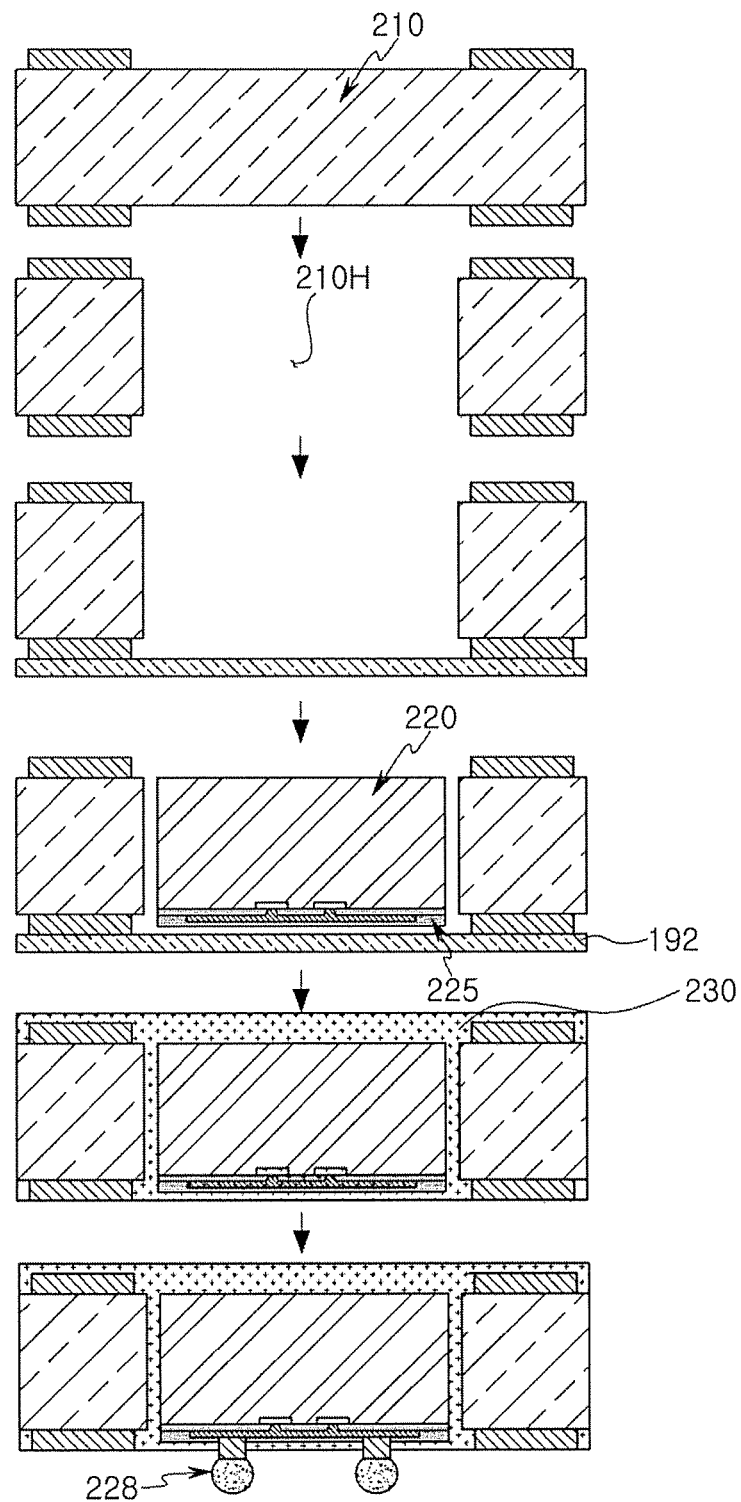
FIG. 16B is schematic views illustrating process steps of a method of manufacturing a second structure of the fan-out semiconductor package of FIG. 9.

FIG. 16B is schematic diagram illustrating process steps of a method of manufacturing a second structure of the fan-out semiconductor package of FIG. 9.

Referring to FIG. 16A, the first core member 110 may be first prepared. The first core member 110 may be prepared by preparing a copper clad laminate (CCL) and then forming the first and second wiring layers 112a and 112b and the vias 113 by a plating process. Then, the first through-hole 110H may be formed in the first core member 110. The first through-hole 110H may be formed using a laser drill and/or a mechanical drill or be formed by a sandblast, or the like. Then, a first adhesive film 191 such as an epoxy tape may be attached to one side of the first core member 110. Then, the first semiconductor chip 120 having the first wiring member 125 formed on the first active surface thereof in advance may be attached to the first adhesive film 191 exposed through the first through-hole 110H. Then, the first semiconductor chip 120 may be encapsulated with the first encapsulant 130. Then, the first adhesive film 191 may be removed, and the connection member 140 and the electrical connection structures 150 may be formed. The connection member 140 may be formed by forming the insulating layers 141 using the PID, or the like, forming via holes in the insulating layers by a photolithography method, and then forming the redistribution layers 142 and the vias 143 by a plating process. The electrical connection structures 150 may be formed by attaching solder balls and performing a reflow process. A series of processes may be performed on a panel level having a large area. In this case, a plurality of first structures 100A connected to each other may be manufactured. When a singulation process such as a dicing process is performed on the plurality of first structures 100A connected to each other, the respective first structures 100A may be obtained.

Referring to FIG. 16B, the second core member 210 may be first prepared. The second core member 210 may also be formed by preparing a CCL and then forming the first and second wiring layers 212a and 212b by a plating process. Then, the second through-hole 210H may be formed in the second core member 210. The second through-hole 210H may be formed using a laser drill and/or a mechanical drill or be formed by a sandblast, or the like. Then, a second adhesive film 192 such as an epoxy tape may be attached to one side of the second core member 210. Then, the second semiconductor chip 220 having the second wiring member 225 formed on the second active surface thereof in advance may be attached to the second adhesive film 192 exposed through the second through-hole 210H. Then, the second semiconductor chip 220 may be encapsulated with the second encapsulant 230. Then, the second adhesive film 192 may be removed, and the conductive bumps 228 may be formed. The conductive bump 228 may be formed by forming a copper bump or a copper pillar on the exposed second wiring layer 222 and forming a solder ball on the other surface of the copper bump or the copper pillar opposing one surface of the copper bump or the copper pillar connected to the second wiring layer 222. A series of processes may also be performed on a panel level having a large area. In this case, a plurality of second structures 200A connected to each other may be manufactured. When a singulation process such as a dicing process is performed on the plurality of second structures 200A connected to each other, the respective second structures 200A may be obtained.

Meanwhile, when the first and second structures 100A and 200A are stacked so that the solder layers 227 of the conductive bumps 228 of the second structure 200 that is manufactured are connected to the redistribution layer 142 of the connection member 140 of the first structure 100A that is manufactured, the fan-out semiconductor package 300A according to the exemplary embodiment may be manufactured.

Figure 17:
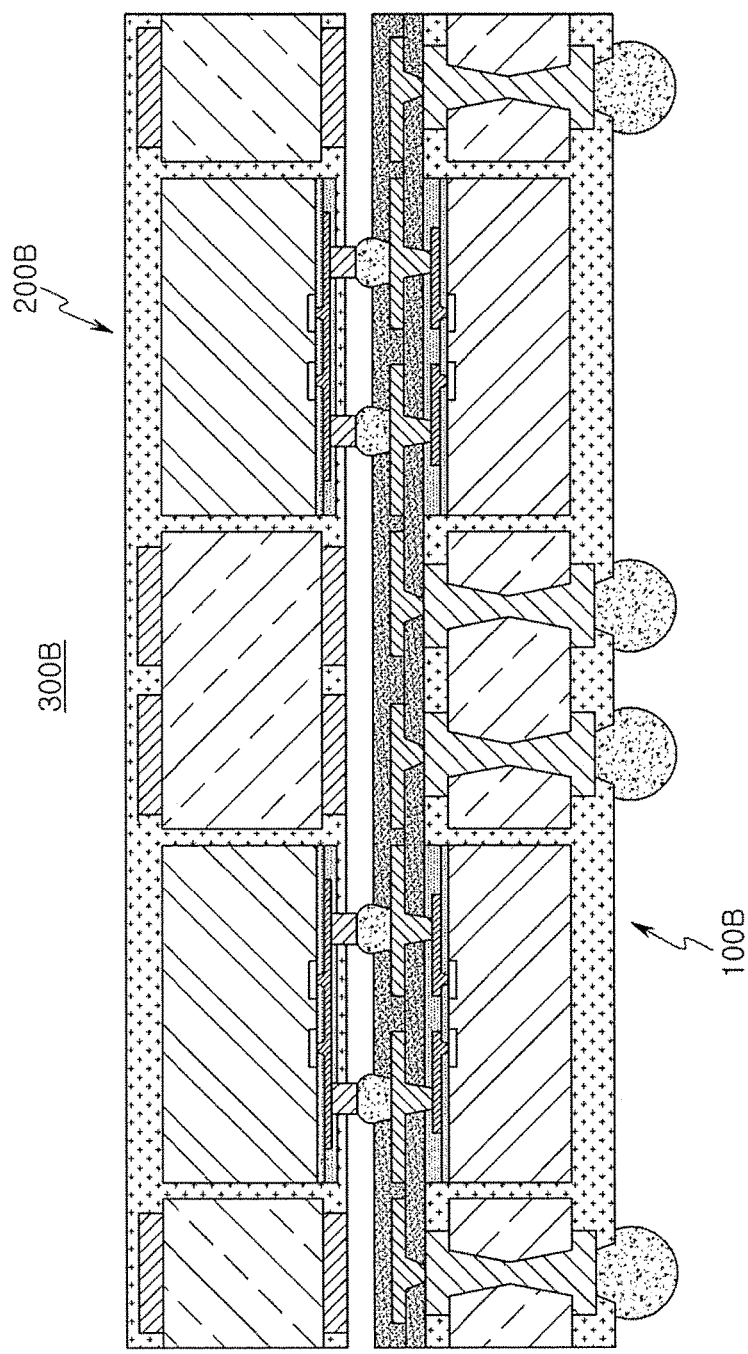
FIG. 17 is a schematic cross-sectional view illustrating another example of a fan-out semiconductor package.

FIG. 17 is a schematic cross-sectional view illustrating another example of a fan-out semiconductor package.

Referring to FIG. 17, in a fan-out semiconductor package 300B according to another exemplary embodiment, a first structure 100B may have a plurality of first through-hole 110H, and first semiconductor chips 120 may be disposed in the first through-holes 110H, respectively. Similarly, a second structures 200B may have a plurality of second through-holes 210H, and second semiconductor chips 220 may be disposed in the second through-holes 210H, respectively. As described above, in the fan-out semiconductor package 300B according to another exemplary embodiment, the first structure 100B may include a plurality of first semiconductor chips 120 disposed side-by-side with each other and connected to each other through a redistribution layer 142 in a signal manner, and the second structure 200B may include a plurality of second semiconductor chips 220 disposed side-by-side with each other and connected to each other through the redistribution layer 142 in a signal manner, and performance of the fan-out semiconductor package 300B may thus be further improved. Other contents overlap those described above, and a detailed description thereof is thus omitted.

Figure 18:
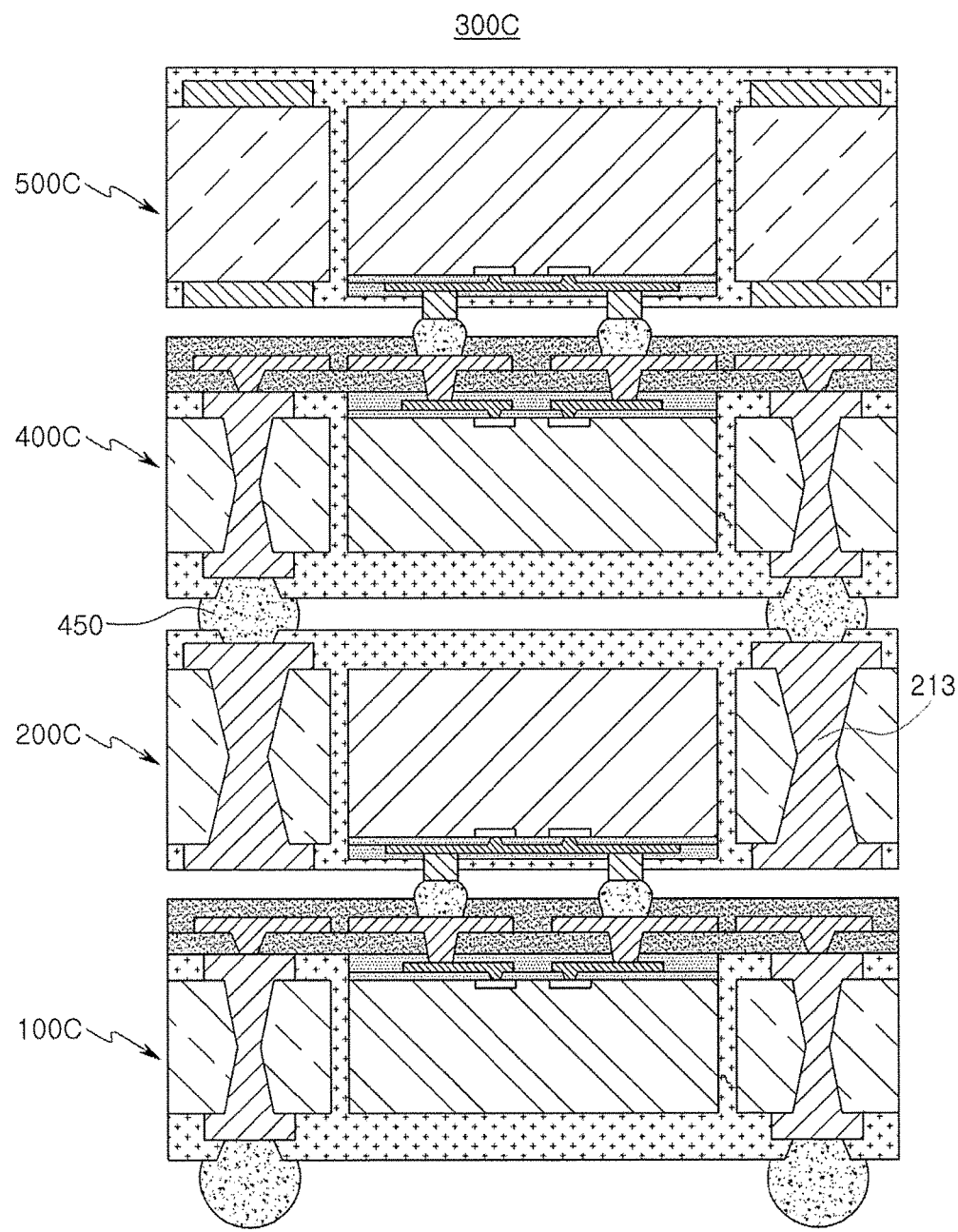
FIG. 18 is a schematic cross-sectional view illustrating another example of a fan-out semiconductor package.

FIG. 18 is a schematic cross-sectional view illustrating another example of a fan-out semiconductor package.

Referring to FIG. 18, in a fan-out semiconductor package 300C according to another exemplary embodiment, a third structure 400C and a fourth structure 500C as well as a first structure 100C and a second structure 200C may be stacked. Electrical connection structures 450 of the third structure 400C may be electrically connected to an exposed second wiring layer 212b of a second core member 210 of the second structure 200C. The second core member 210 of the second structure 200C may further include vias 213 electrically connecting first and second wiring layers 212a and 212b to each other for providing an electrical connection between upper and lower portions. Except for those described above, the third structure 400C and the fourth structure 500C may have structures that are substantially the same as those of the first structure 100C and the second structure 200C, respectively. That is, in the fan-out semiconductor package 300C according to another exemplary embodiment, a larger number of structures 100C, 200C, 400C, and 500C are stacked in a vertical direction, and performance of the fan-out semiconductor package 300C may thus be further improved. Other contents overlap those described above, and a detailed description thereof is thus omitted.

Figure 19:
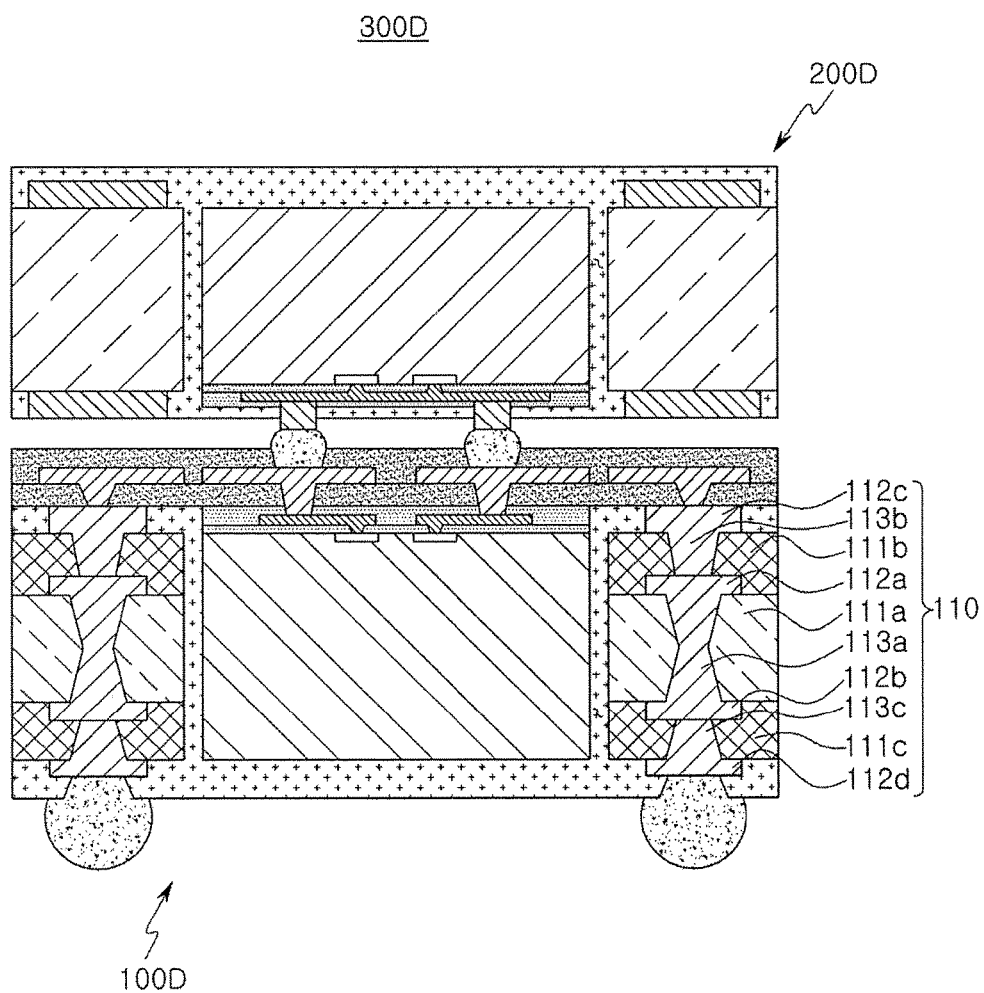
FIG. 19 is a schematic cross-sectional view illustrating another example of a fan-out semiconductor package.

FIG. 19 is a schematic cross-sectional view illustrating another example of a fan-out semiconductor package.

Referring to FIG. 19, in a fan-out semiconductor package 300D according to another exemplary embodiment, a first core member 110 of a first structure 100D may include a larger number of wiring layers 112a, 112b, 112c, and 112d. In more detail, the first core member 110 may include a first insulating layer 111a, a first wiring layer 112a and a second wiring layer 112b disposed on first and second surfaces of the first insulating layer 111a, respectively, a second insulating layer 111b disposed on the first surface of the first insulating layer 111a and covering the first wiring layer 112a, a third wiring layer 112c disposed on the second insulating layer 111b, a third insulating layer 111c disposed on the second surface of the first insulating layer 111a and covering the second wiring layer 112b, and a fourth wiring layer 112d disposed on the third insulating layer 111c. The first to fourth wiring layers 112a, 112b, 112c, and 112d may be electrically connected to first and second connection pads 120P and 220P. Since the first core member 110 may include a larger number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c each penetrating through a respective one of the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

The first wiring layer 112a and the second wiring layer 112b of the first core member 110 may be disposed on a level between an active surface and an inactive surface of a first semiconductor chip 120. The first core member 110 may be formed at a thickness corresponding to that of the first semiconductor chip 120, and the first wiring layer 112a and the second wiring layer 112b formed in the first core member 110 may thus be disposed on a level between the active surface and the inactive surface of the first semiconductor chip 120. A thickness of each of the wiring layers 112a, 112b, 112c, and 112d may be greater than that of the redistribution layer 142. A description of other configurations, for example, a second structure 200D, overlaps the description provided above and is thus omitted.

Figure 20:
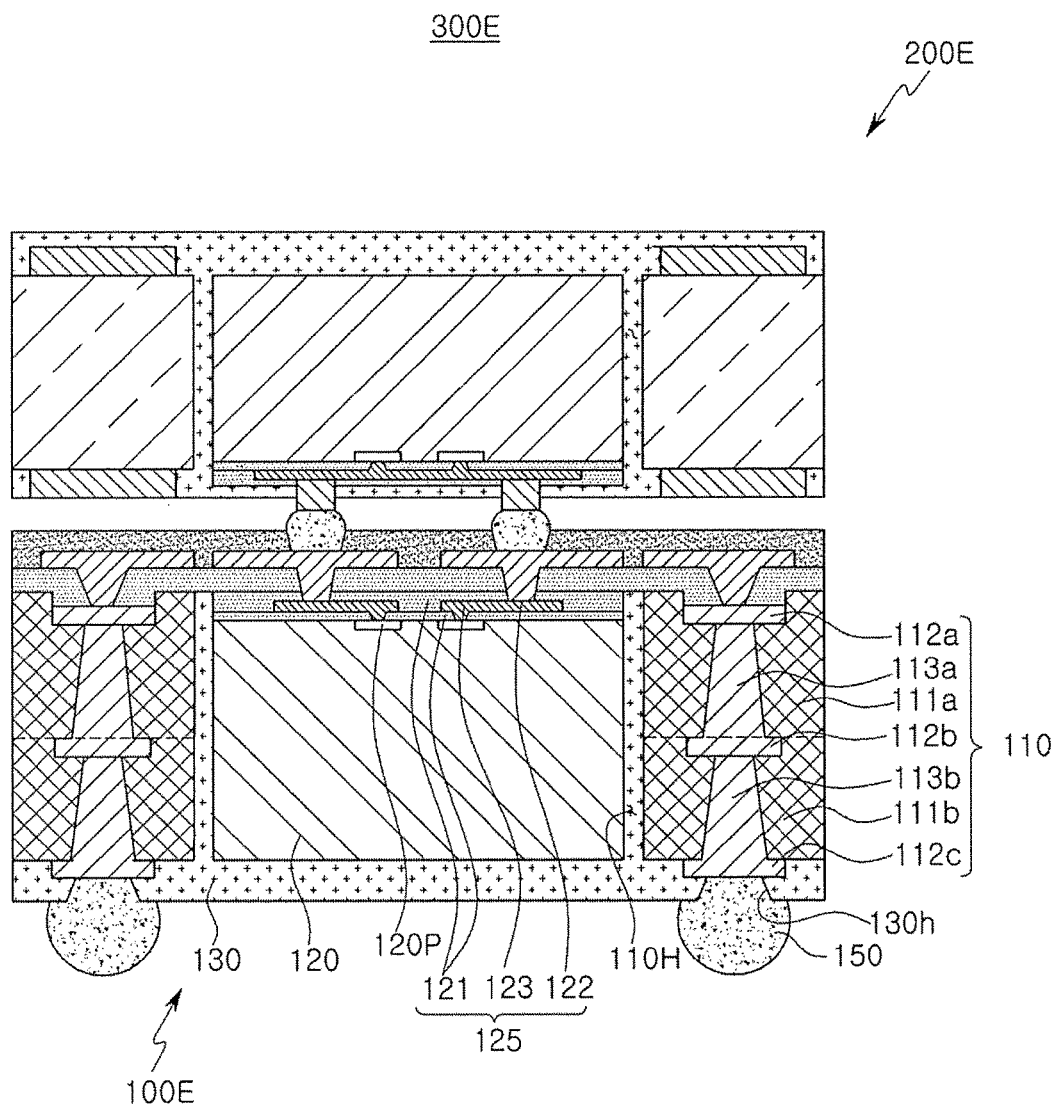
FIG. 20 is a schematic cross-sectional view illustrating another example of a fan-out semiconductor package.

FIG. 20 is a schematic cross-sectional view illustrating another example of a fan-out semiconductor package.

Referring to FIG. 20, in a fan-out semiconductor package 300E according to another exemplary embodiment, a first core member 110 of a first structure 100E may include a first insulating layer 111a in contact with a connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to first and second connection pads 120P and 220P. The first and second wiring layers 112a and 112b and the second and third wiring layers 112b and 112c may be electrically connected to each other through first and second vias 113a and 113b penetrating through the first and second insulating layers 111a and 111b, respectively.

An upper surface of the first wiring layer 112a of the first core member 110 may be disposed on a level below an upper surface of the first connection pad 120P of a first semiconductor chip 120. In addition, a distance between a redistribution layer 142 of the connection member 140 and the first wiring layer 112a of the first core member 110 may be greater than that between the redistribution layer 142 of the connection member 140 and the first connection pad 120P of the first semiconductor chip 120. The reason is that the first wiring layer 112a may be recessed into the first insulating layer 111a. As described above, when the first wiring layer 112a is recessed in the first insulating layer 111a, such that an upper surface of the first insulating layer 111a and the upper surface of the first wiring layer 112a have a step therebetween, a phenomenon in which a material of the first encapsulant 130 bleeds to pollute the first wiring layer 112a may be prevented. The second wiring layer 112b of the first core member 110 may be disposed on a level between an active surface and an inactive surface of the first semiconductor chip 120. A thickness of each of the wiring layers 112a, 112b, and 112c may be greater than that of the redistribution layer 142. A description of other configurations, for example, a second structure 200E, overlaps with the description provided above and is thus omitted.

Figure 21:
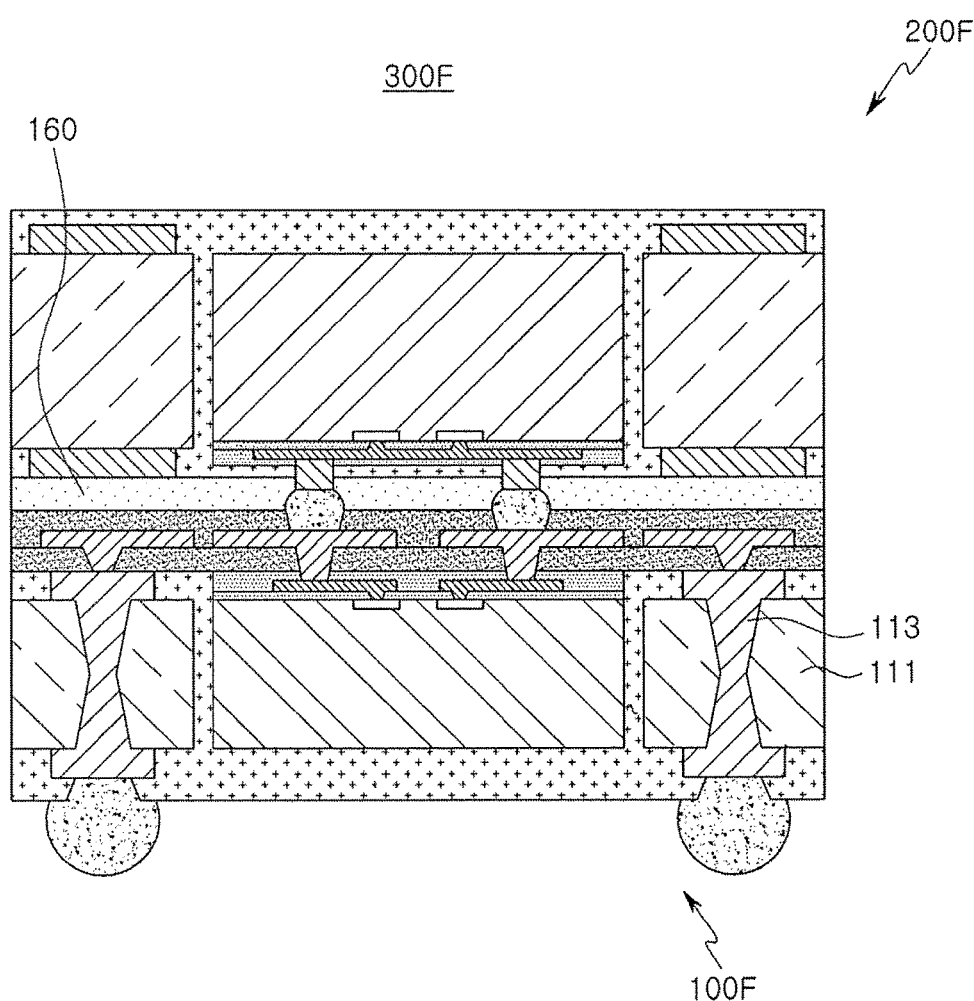
FIG. 21 is a schematic cross-sectional view illustrating another example of a fan-out semiconductor package.

FIG. 21 is a schematic cross-sectional view illustrating another example of a fan-out semiconductor package.

Referring to FIG. 21, in a fan-out semiconductor package 300F according to another exemplary embodiment, an insulating member 160 may be disposed between a first structure 100F and a second structure 200F. The insulating member 160 may be a non-conductive paste, a non-conductive film, or the like, including an insulating material. The insulating member 160 may cover at least portions of conductive bumps 228. In this way, joint reliability between the first structure 100F and the second structure 200F may be improved. A description of other configurations overlaps that described above and is thus omitted.

Figure 22:
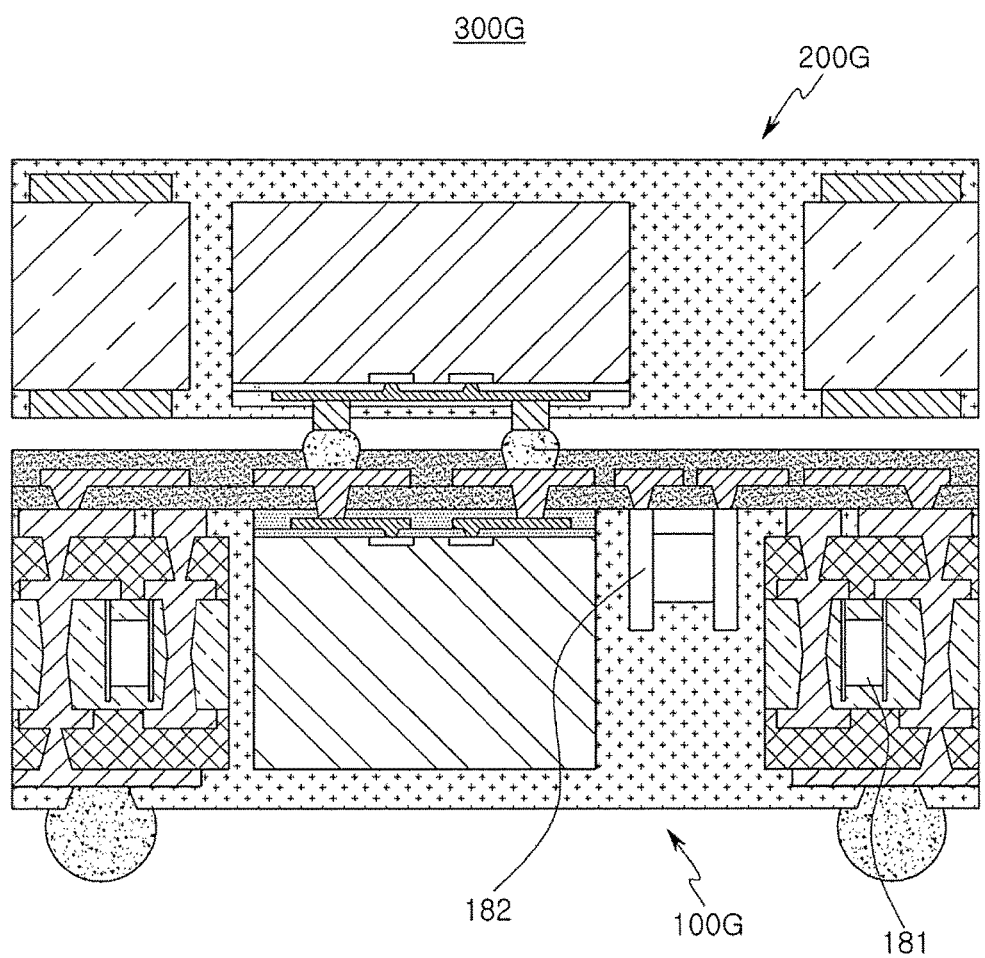
FIG. 22 is a schematic cross-sectional view illustrating another example of a fan-out semiconductor package.

FIG. 22 is a schematic cross-sectional view illustrating another example of a fan-out semiconductor package.

Referring to FIG. 22, a fan-out semiconductor package 300G according to another exemplary embodiment may be substantially the same as the fan-out semiconductor package 300D according to another exemplary embodiment described above except that it further includes a plurality of passive components 181 and 182. In detail, a first passive component 181 may be embedded in a first core member 110 of a first structure 100G, and a second passive component 182 may be disposed in a first through-hole 110H of the first core member 110. The first and second passive components 181 and 182 may be any known passive components such as capacitors, inductors, beads, or the like, respectively, and may be the same as or different from each other. The first and second passive components 181 and 182 may be electrically connected to power pads, ground pads, or the like, of first and second connection pads 120P and 220P through a redistribution layer 142. A passive component (not illustrated) may also be disposed in a second core member 210 of a second structure 200G, if necessary. A description of other configurations overlaps that described above and is thus omitted.

Figure 23:
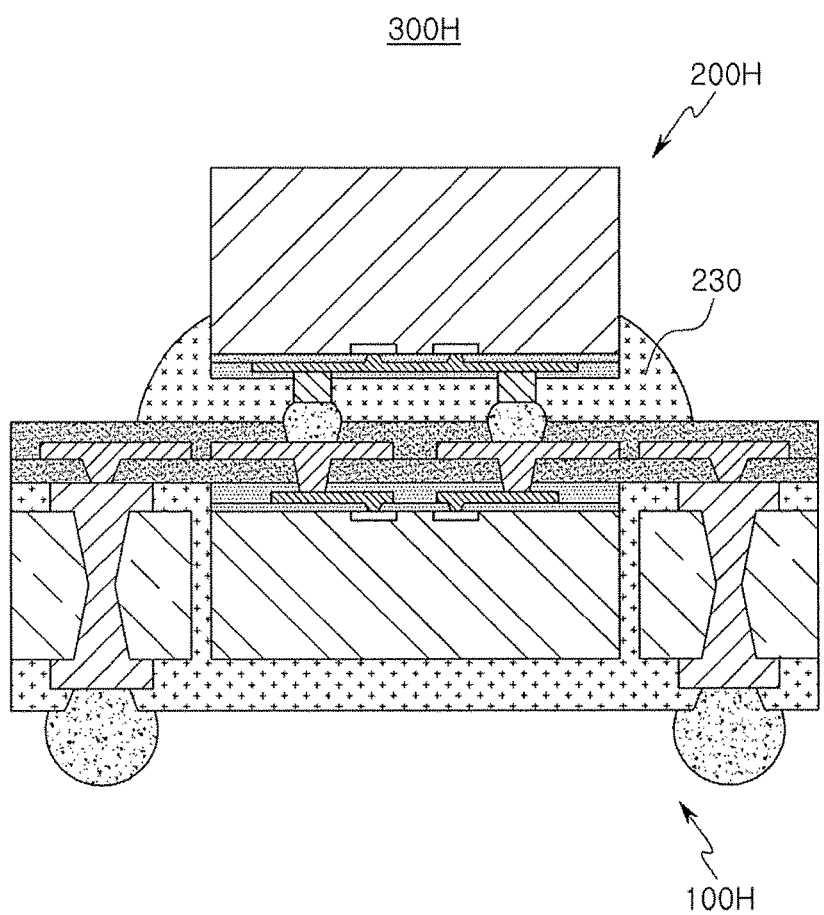
FIG. 23 is a schematic cross-sectional view illustrating another example of a fan-out semiconductor package.

FIG. 23 is a schematic cross-sectional view illustrating another example of a fan-out semiconductor package.

Referring to FIG. 23, in a fan-out semiconductor package 300H according to another exemplary embodiment, a first structure 100H and a second structure 200H may be stacked in a package-on-chip form. In detail, a second semiconductor chip 220 may be mounted on a first structure 100H through conductive bumps 228, and a second encapsulant 230 may be formed in an underfill resin form on the first structure 100H to fix the second semiconductor chip. A description of other configurations overlaps that described above and is thus omitted.

Figure 24:
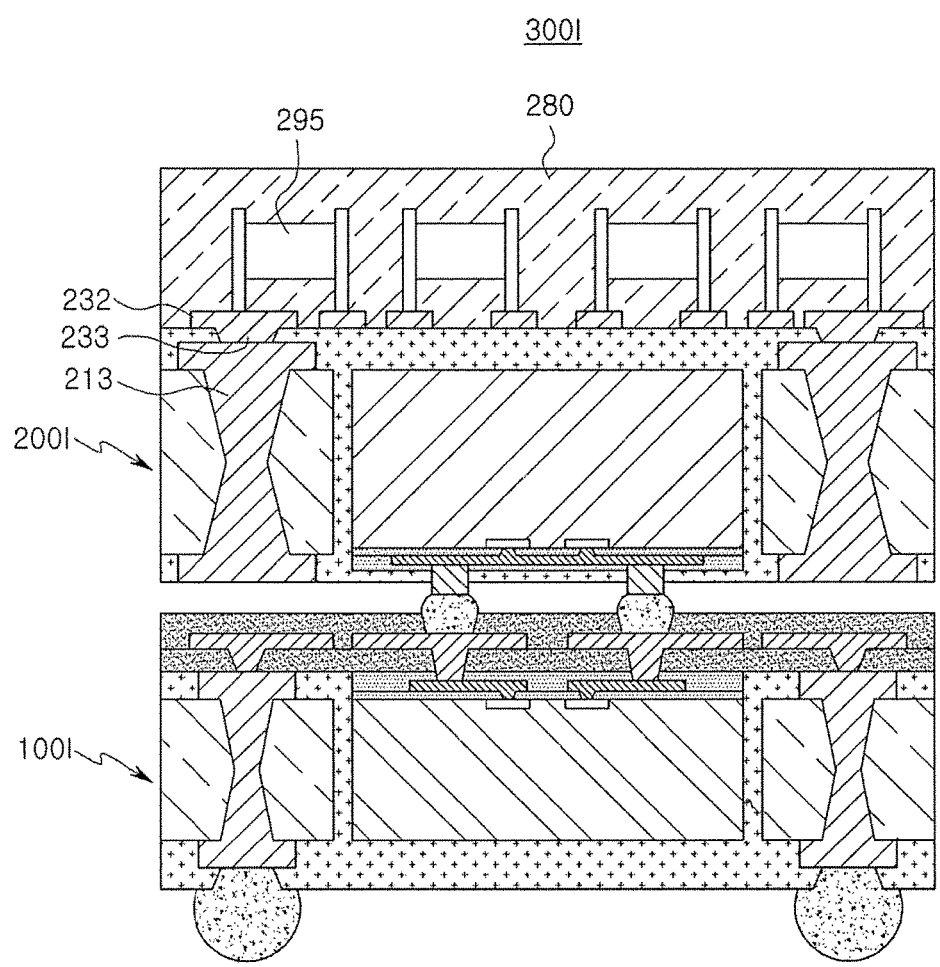
FIG. 24 is a schematic cross-sectional view illustrating another example of a fan-out semiconductor package.

FIG. 24 is a schematic cross-sectional view illustrating another example of a fan-out semiconductor package.

Referring to FIG. 24, in a fan-out semiconductor package 300I according to another exemplary embodiment, a first structure 100I and a second structure 200I may be stacked in a package-on-package form, and a plurality of surface mounting components 295 may be mounted on the second structure 200I. The surface mounting components 295 may be any known passive components such as capacitors, inductors, beads, or the like, or be various kinds of integrated circuits. The surface mounting components 295 may be the same as or different from each other. The surface mounting components 295 may be molded by a molding material 280 formed on the second structure 200I. A second core member 210 of the second structure 200I may further include vias 213 electrically connecting first and second wiring layers 212a and 212b in order to provide an electrical connection path between upper and lower portions, a backside wiring layer 232 may be formed on a second encapsulant 230, and the backside wiring layer 232 may be electrically connected to the second wiring layer 212b of the second core member 210 through backside vias 233 penetrating through at least portions of the second encapsulant 230. The surface mounting components 295 may be mounted on the backside wiring layer 232 to be electrically connected to components of the first and second structures 100I and 200I. A description of other configurations overlaps that described above and is thus omitted.

As set forth above, according to the exemplary embodiments, a fan-out semiconductor package capable of solving a time delay problem in spite of including a plurality of semiconductor chips and being thinned in spite of having improved performance may be provided.

While exemplary embodiments have been shown and described above, it will be apparent to those skilled in the art that modifications and variations could be made without departing from the scope of the present invention as defined by the appended claims.

What is claimed is:
1. A fan-out semiconductor package comprising:
  a first structure including a first semiconductor chip having a first active surface having first connection pads disposed thereon and a first inactive surface opposing the first active surface, a first encapsulant encapsulating at least portions of the first semiconductor chip, a connection member disposed on the first encapsulant, and the first active surface and including a redistribution layer that includes first conductors extending in a direction parallel with the first active surface to be electrically connected to the first connection pads, and a first wiring member disposed between the first active surface and the connection member and including a first wiring layer that includes second conductors extending in the direction parallel with the first active surface to redistribute the first connection pads to electrically connect the first connection pads to the redistribution layer; and
  a second structure including a second semiconductor chip having a second active surface having second connection pads disposed thereon and a second inactive surface opposing the second active surface, a second encapsulant encapsulating at least portions of the second semiconductor chip, and conductive bumps disposed on the second active surface and electrically connected to the second connection pads,
  wherein the first and second structures are disposed so that the first and second active surfaces face each other,
  the conductive bumps are electrically connected to the redistribution layer, and
  the first and second connection pads are electrically connected to each other through the redistribution layer in a signal manner.

2. The fan-out semiconductor package of claim 1, wherein a signal transmission time from the first connection pad to one point of the redistribution layer and a signal transmission time from the second connection pad to the one point are substantially the same as each other.

3. The fan-out semiconductor package of claim 1, wherein a signal transmission distance from the first connection pad to one point of the redistribution layer and a signal transmission distance from the second connection pad to the one point are substantially the same as each other.

4. The fan-out semiconductor package of claim 1, wherein a signal transmission distance from the first connection pad to one point of the redistribution layer and a signal transmission distance from the second connection pad to the one point are different from each other, and the redistribution layer compensates for the different signal transmission distances to allow signal transmission times to be substantially the same as each other.

5. The fan-out semiconductor package of claim 1, wherein the conductive bump includes a copper (Cu) layer and a solder layer.

6. The fan-out semiconductor package of claim 1, wherein the second structure further includes a second wiring member disposed between the second active surface and the conductive bumps and including a second wiring layer redistributing the second connection pads to electrically connect the second connection pads to the conductive bumps.

7. The fan-out semiconductor package of claim 6, wherein the first connection pads include first and second signal pads spaced apart from each other, the second connection pads include third and fourth signal pads spaced apart from each other, the first and fourth signal pads face each other in a cross section, the second and third signal pads face each other in the cross section, the first and third signal pads are redistributed to be connected to each other in a signal manner, and the second and fourth signal pads are redistributed to be connected to each other in a signal manner.

8. The fan-out semiconductor package of claim 7, wherein the first and second semiconductor chips are a same type of memory chips.

9. The fan-out semiconductor package of claim 1, wherein the first structure further includes a first core member having a first through-hole in which the first semiconductor chip is accommodated, and the first encapsulant covers at least portions of the first core member and the first inactive surface of the first semiconductor chip, and fills at least portions of the first through hole.

10. The fan-out semiconductor package of claim 9, wherein the second structure further include a second core member having a second through-hole in which the second semiconductor chip is accommodated, and the second encapsulant covers at least portions of the second core member and the second inactive surface of the second semiconductor chip, and fills at least portions of the second through-hole.

11. The fan-out semiconductor package of claim 9, wherein the first core member includes a first insulating layer in contact with the connection member, a first wiring layer in contact with the connection member and embedded in the first insulating layer, a second wiring layer disposed on the other surface of the first insulating layer opposing one surface of the first insulating layer in which the first wiring layer is embedded, a second insulating layer disposed on the first insulating layer and covering the second wiring layer, a third wiring layer disposed on the second insulating layer, first vias penetrating through the first insulating layer and electrically connecting the first and second wiring layers to each other, and second vias penetrating through the second insulating layer and electrically connecting the second and third wiring layers, and the first, second, and third wiring layers are electrically connected to the first and second connection pads.

12. The fan-out semiconductor package of claim 9, wherein the first core member includes a plurality of wiring layers electrically connected to the first and second connection pads through the redistribution layer and one layer or more vias electrically connecting the plurality of wiring layers to each other.

13. The fan-out semiconductor package of claim 12, wherein the first encapsulant is formed on the other surface of the first core member opposing one surface of the first core member on which the connection member is disposed, and has openings exposing at least portions of one of the plurality of wiring layers, and the first structure further includes electrical connection structures formed in the openings of the first encapsulant and electrically connected to one of the plurality of wiring layers exposed by the openings.

14. The fan-out semiconductor package of claim 9, wherein the first core member includes a first insulating layer, a first wiring layer disposed on a first surface of the first insulating layer, a second wiring layer disposed on a second surface of the first insulating layer, and first vias penetrating through the first insulating layer and electrically connecting the first and second wiring layers to each other, and the first and second wiring layers are electrically connected to the first and second connection pads.

15. The fan-out semiconductor package of claim 14, wherein the first core member further includes a second insulating layer disposed on the first surface of the first insulating layer and covering the first wiring layer, a third wiring layer disposed on the second insulating layer, a third insulating layer disposed on the second surface of the first insulating layer and covering the second wiring layer, a fourth wiring layer disposed on the third insulating layer, second vias penetrating through the second insulating layer and electrically connecting the first and third wiring layers to each other, and third vias penetrating through the third insulating layer and electrically connecting the second and fourth wiring layers to each other, and the third and fourth wiring layers are electrically connected to the first and second connection pads.

16. A fan-out semiconductor package comprising:

a first structure including a first semiconductor chip having a first active surface having first and second signal pads disposed thereon and a first inactive surface opposing the first active surface, a first wiring member disposed on the first active surface of the first semiconductor chip and including a first wiring layer that includes first conductors extending in a direction parallel with the first active surface to redistribute the first and second signal pads, a first encapsulant encapsulating at least portions of the first semiconductor chip and the first wiring member, and a connection member disposed on the first encapsulant and the first wiring member and including a redistribution layer that includes second conductors extending in the direction parallel with the first active surface to be electrically connected to the first and second signal pads through the first wiring layer, the first and second signal pads being spaced apart from each other; and a second structure including a second semiconductor chip having a second active surface having third and fourth signal pads disposed thereon and a second inactive surface opposing the second active surface, a second wiring member disposed on the second active surface of the second semiconductor chip and including a second wiring layer that includes third conductors extending in a direction parallel with the second active surface to redistribute the third and fourth signal pads, a second encapsulant encapsulating at least portions of the second semiconductor chip and the second wiring member, and conductive bumps disposed on the second active surface and electrically connected to the third and fourth signal pads through the second wiring layer, the third and fourth signal pads being spaced apart from each other, wherein the first and second structures are disposed so that the first and second active surfaces face each other, the conductive bumps are electrically connected to the redistribution layer, the first and fourth signal pads face each other in a cross section, the second and third signal pads face each other in the cross section, the first and third signal pads are redistributed to be connected to each other in a signal manner, and the second and fourth signal pads are redistributed to be connected to each other in a signal manner.

17. The fan-out semiconductor package of claim 16, wherein the first and second semiconductor chips are the same type of dynamic random access memories (DRAMs).

18. A fan-out semiconductor package comprising:

a first semiconductor chip having a first active surface having first connection pads disposed thereon;

a redistribution layer disposed on the first active surface of the first semiconductor chip and electrically connected to the first connection pads;

a second semiconductor chip having a second active surface having second connection pads disposed thereon, wherein the second semiconductor chip is disposed to have the second active surface facing and overlapping with the first active surface of the first semiconductor chip; and conductive bumps disposed on the second active surface and electrically connecting second connection pads to the redistribution layer, wherein the redistribution layer includes a resistance pattern in a conductive line electrically connected to at least one of the first and second connection pads.

19. The fan-out semiconductor package of claim 18, wherein the resistance pattern includes at least one of a spiral pattern, a meander line, and a loop pattern in the conductive line electrically connected to the at least one of the first and second connection pads.

20. The fan-out semiconductor package of claim 18, wherein the resistance pattern provides a time delay in the propagation of signals through the conductive line that provides for a signal transmission time from a first connection pad to one point of the redistribution layer and a signal transmission time from a second connection pad to the one point to be substantially the same as each other.

* * * * *